United States Patent
Lee et al.

(10) Patent No.: US 9,748,956 B2
(45) Date of Patent: Aug. 29, 2017

(54) INTEGRATED CIRCUIT AND STORAGE DEVICE INCLUDING THE SAME

(71) Applicant: Samsung Electronics Co., Ltd., Suwon-si, Gyeonggi-do (KR)

(72) Inventors: Jangwoo Lee, Seoul (KR); HyunJin Kim, Hwaseong-si (KR); Daehoon Na, Seoul (KR); Jeongdon Ihm, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/960,748

(22) Filed: Dec. 7, 2015

(65) Prior Publication Data

US 2016/0204782 A1 Jul. 14, 2016

(30) Foreign Application Priority Data

Jan. 13, 2015 (KR) .................. 10-2015-0006040

(51) Int. Cl.

| | |
|---|---|
| *H03K 17/16* | (2006.01) |
| *H03K 19/003* | (2006.01) |
| *H03K 19/0175* | (2006.01) |
| *G11C 7/04* | (2006.01) |
| *G11C 7/10* | (2006.01) |
| *G11C 29/02* | (2006.01) |
| *G11C 16/04* | (2006.01) |

(52) U.S. Cl.
CPC ....... *H03K 19/017545* (2013.01); *G11C 7/04* (2013.01); *G11C 7/1069* (2013.01); *G11C 7/1096* (2013.01); *G11C 29/022* (2013.01); *G11C 29/028* (2013.01); *G11C 16/0483* (2013.01); *G11C 2207/105* (2013.01); *G11C 2207/108* (2013.01)

(58) Field of Classification Search
CPC H03K 19/017545; G11C 7/04; G11C 7/1069; G11C 7/1096; G11C 29/022; G11C 29/028; G11C 16/0483; G11C 2207/105; G11C 2207/108
USPC ........................ 326/30; 365/189.17; 710/305
See application file for complete search history.

(56) References Cited

U.S. PATENT DOCUMENTS

| | | | |
|---|---|---|---|
| 5,898,321 A * | 4/1999 | Ilkbahar | H03K 17/164 326/30 |
| 6,636,821 B2 | 10/2003 | Lawson | |
| 7,679,133 B2 | 3/2010 | Son et al. | |

(Continued)

FOREIGN PATENT DOCUMENTS

| | | |
|---|---|---|
| KR | 2010-0002856 A | 1/2010 |
| KR | 2011-0013704 A | 2/2011 |

(Continued)

*Primary Examiner* — Daniel D Chang
(74) *Attorney, Agent, or Firm* — Harness, Dickey & Pierce, P.L.C.

(57) ABSTRACT

An integrated circuit includes an input/output pad, a driver circuit connected to the input/output pad, and a receiver circuit connected to the input/output pad, and a code generator. The driver circuit is configured to output an output signal to an external device through the input/output pad. The receiver circuit is configured to receive an input signal from the external device through the input/output pad. The code generator is configured to generate a termination code of the external device in response to a signal output from the receiver circuit.

20 Claims, 19 Drawing Sheets

(56) References Cited

U.S. PATENT DOCUMENTS

| | | |
|---|---|---|
| 7,898,290 B2 | 3/2011 | Kim |
| 7,969,182 B2 | 6/2011 | Kim et al. |
| 8,339,156 B2 | 12/2012 | Kim |
| 8,553,466 B2 | 10/2013 | Han et al. |
| 8,559,235 B2 | 10/2013 | Yoon et al. |
| 8,654,587 B2 | 2/2014 | Yoon et al. |
| 2002/0084800 A1* | 7/2002 | Crittenden ........... H03K 17/167 326/30 |
| 2008/0079457 A1* | 4/2008 | Yuan ................. H03K 19/0005 326/30 |
| 2009/0237109 A1* | 9/2009 | Haig .................. H04L 25/0278 326/30 |
| 2010/0308861 A1 | 12/2010 | Lee |
| 2011/0216612 A1 | 9/2011 | Ishikawa |
| 2011/0233648 A1 | 9/2011 | Seol et al. |
| 2012/0113705 A1 | 5/2012 | Janzen |
| 2013/0076399 A1 | 3/2013 | Jeong |
| 2013/0113517 A1 | 5/2013 | Ko |
| 2014/0185384 A1 | 7/2014 | Kim et al. |
| 2014/0266299 A1 | 9/2014 | Seol et al. |
| 2015/0364173 A1 | 12/2015 | Kim et al. |

FOREIGN PATENT DOCUMENTS

| | | |
|---|---|---|
| KR | 2014-0077588 A | 6/2014 |
| KR | 20150143943 A | 12/2015 |

\* cited by examiner

FIG. 5
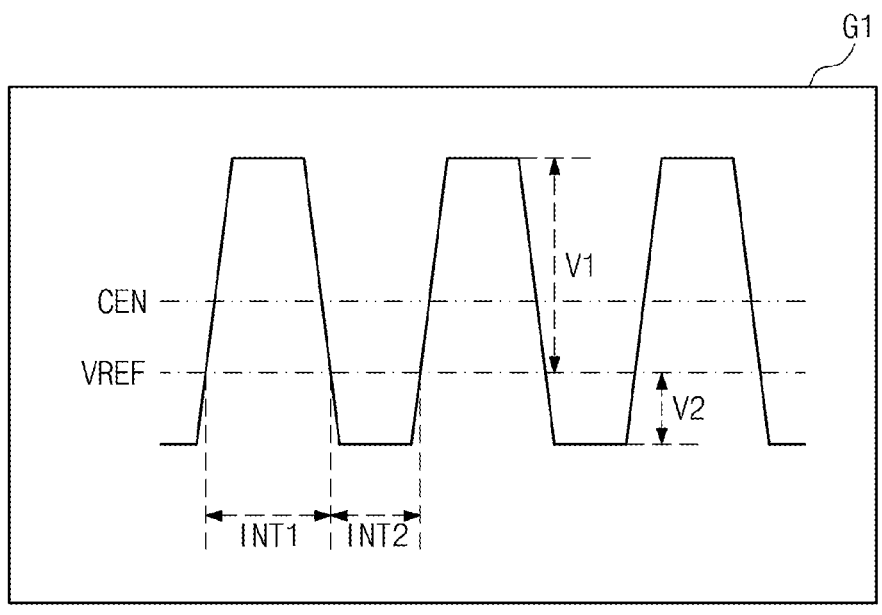
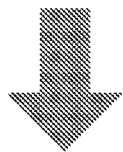
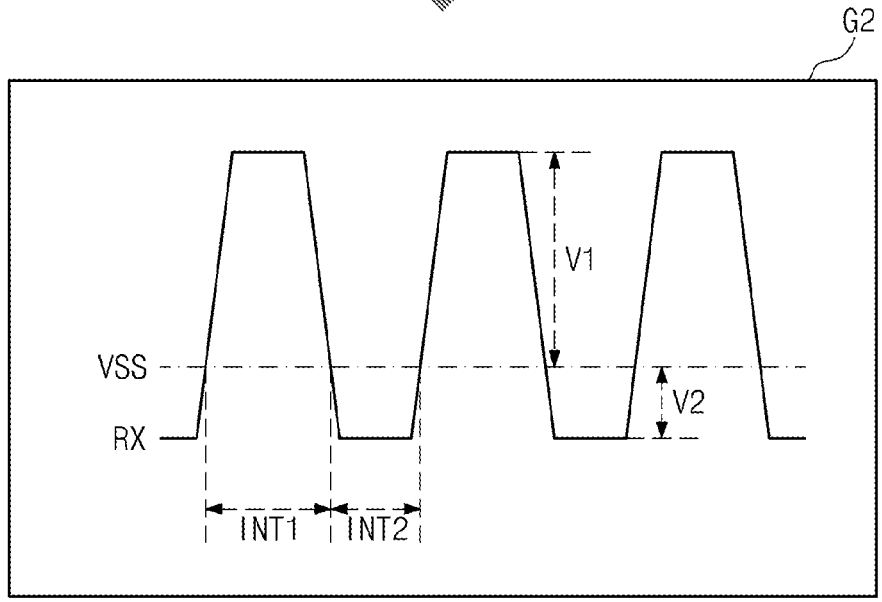

FIG. 6
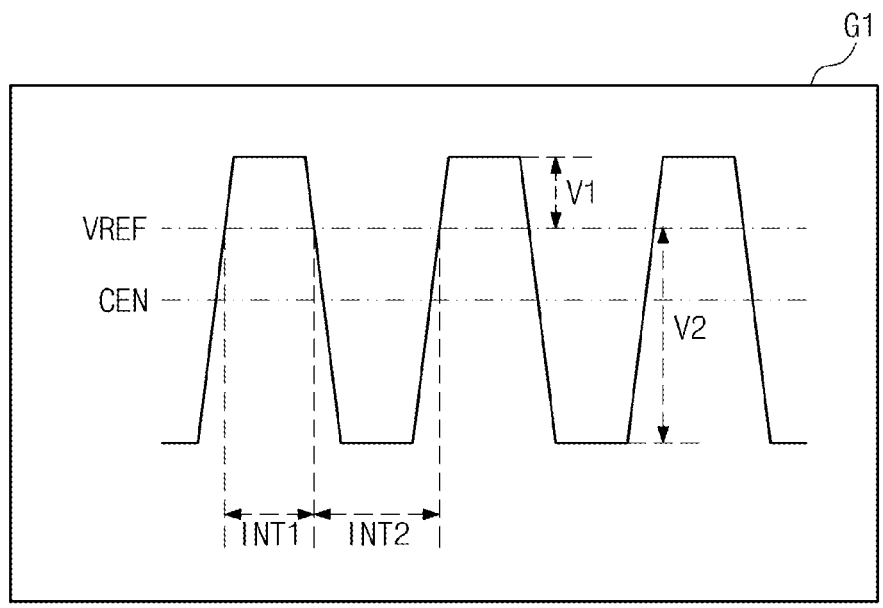
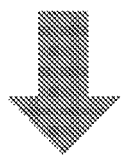
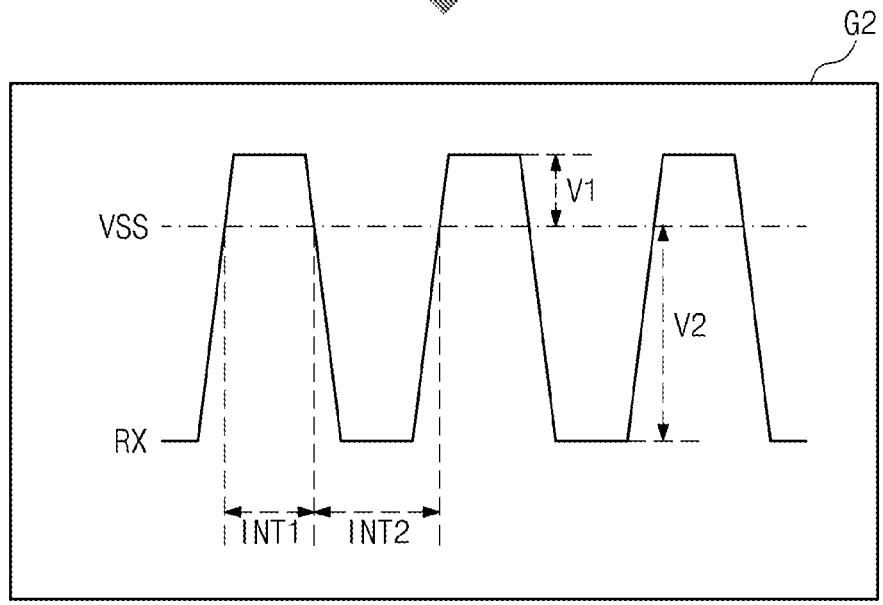

FIG. 18
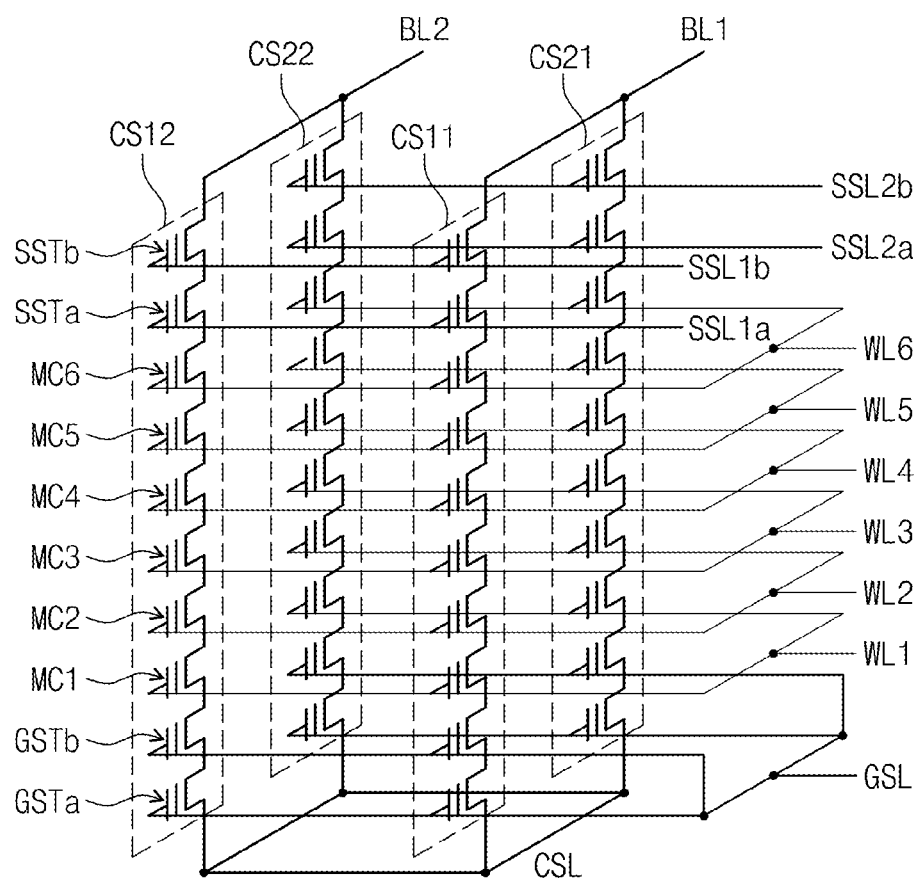
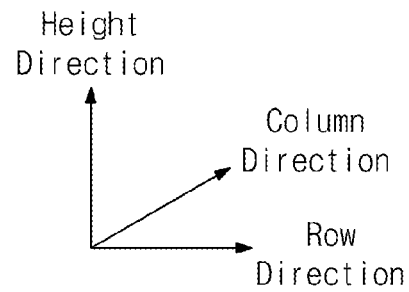

INTEGRATED CIRCUIT AND STORAGE DEVICE INCLUDING THE SAME

CROSS-REFERENCE TO RELATED APPLICATIONS

This US non-provisional patent application claims priority under 35 USC §119 to Korean Patent Application No. 10-2015-0006040, filed on Jan. 13, 2015, the entirety of which is hereby incorporated by reference.

BACKGROUND

The present disclosure relates to electronic circuits and, more particularly, to an integrated circuit and a storage device including the same.

A storage device is a device configured to store data according to the control of a host device such as a computer, a smartphone, and a smart pad. The storage device includes a device such as a hard disk drive (HDD) to store data in a magnetic disk and a device such as a solid state drive (SSD) and a memory card to store data in a semiconductor memory, such as a nonvolatile memory.

A storage device includes one or more integrated circuits. For example, the storage device may include a plurality of integrated circuits of a nonvolatile memory and a single integrated circuit of a memory controller.

An on-die termination (ODT) circuit may be provided to an integrated circuit to limit and/or prevent reflection of a signal when integrate circuits communicate with each other. The ODT circuit may support impedance matching between a channel and an output pad of an integrated circuit to limit and/or prevent reflection of a signal when the signal is output through the output pad.

An ODT circuit may include a plurality of resistors to achieve impedance matching. Resistances of the resistors of the ODT circuit may vary depending on a manufacturing process, a voltage, and temperature. A ZQ calibration circuit is provided to an integrated circuit to correct variation in the resistances of the resistors of the ODT circuit. The ZQ calibration circuit may be configured to adjust the resistances of the resistors of the ODT circuit or may be implemented with variable resistors of the ODT circuit.

As mentioned above, a storage device includes a single integrated circuit of a memory controller and a plurality of integrated circuits of a nonvolatile memory. The integrated circuit of the memory controller may be configured to communicate with the plurality of integrated circuits of the nonvolatile memory. Since each of the integrated circuits may include a ZQ calibration circuit, the manufacturing cost of a storage device increases and a size of the storage device may increase.

SUMMARY

The present disclosure relates to an integrated circuit and a storage device.

An integrated circuit according to example embodiments of inventive concepts includes: an input/output pad; a driver circuit connected to the input/output pad, the driver circuit being configured to output an output signal to an external device through the input/output pad; a receiver circuit connected to the input/output pad, the receiver circuit being configured to receive an input signal from the external device through the input/output pad; and a code generator configured to generate a termination code of the external device in response to a signal output from the receiver circuit.

In example embodiments, the code generator may be configured to detect a duty ratio of the signal output from the receiver circuit.

In example embodiments, the termination code may include information on whether the detected duty ratio is greater than a reference ratio or smaller than the reference ratio.

In example embodiments, the code generator may be configured to detect a high level and a low level of the signal output from the receiver circuit.

In example embodiments, the termination code may include information on a magnitude of the high level of the signal output from the receiver circuit and a magnitude of the low level of the signal output from the receiver circuit.

In example embodiments, the driver circuit may be configured to output the terminal code to the external device through the input/output pad as the output signal.

In example embodiments, the integrated circuit may further include a second input/output pad, a second driver circuit, and a second receiver circuit. The second driver circuit may be connected to the second input/output pad. The second driver circuit may be configured to output a second output signal to a second external device through the second input/output pad. The second receiver circuit may be connected to the second input/output pad. The second receiver circuit may be configured to receive a second input signal from the second external device through the second input/output pad.

In example embodiments, the second driver circuit may be configured to output the termination code to the second external device through the second input/output pad as the second output signal.

In example embodiments, the code generator may be configured to detect the termination code in response to a command received from the second external device through the second input/output pad as the second input signal.

In example embodiments, the code generator may be configured to detect the termination code in a test mode.

In example embodiments, the integrated circuit may be configured to transfer a signal output from the receiver circuit to the second driver circuit after retiming the signal output from the receiver circuit and to transfer a signal output from the second receiver circuit to the driver circuit after retiming the signal output from the second receiver circuit.

According to example embodiments of inventive concepts, an integrated circuit includes an input/output pad, a driver circuit, and a receiver circuit. The driver circuit is connected to the input/output pad. The driver circuit is configured to output an output signal to an external device through the input/output pad. The receiver circuit is connected to the input/output pad. The receiver circuit is configured to receive an input signal from the external device through the input/output pad. The driver circuit may be configured to adjust pull-up drive strength and pull-down drive strength based on a termination code received through the input/output pad.

In example embodiments, the driver circuit may include a pull-up driver coupled between the input/output pad and a power supply node and a pull-down driver coupled between the input/output pad and a ground node. The power supply node may be configured to receive a power supply voltage applied thereto. The ground node may be configured to receive a ground voltage applied thereto. The driver circuit may be configured to adjust the pull-up drive strength of the pull-up driver and the pull-down drive strength of the pull-down driver according to the termination code.

In example embodiments, the pull-up driver may include a plurality of switches connected to the power supply node. The pull-up driver may include a plurality of transistor coupled between the switches and the input/output pad, respectively. The pull-up driver may be configured to apply a voltage equivalently to gates of the transistors according to information output as the output signal. The pull-up driver may be configured to activate a number of the switches according to the termination code.

In example embodiments, the driver circuit may be configured to activate one of the pull-up drivers and the pull-down drivers and to deactivate an other one of the pull-up drivers and the pull-down drivers when the driver circuit outputs the output signal. The driver circuit may be configured to simultaneously activate the pull-up drivers and the pull-down drivers when the receiver circuit receives the input signal.

In example embodiments, the integrated circuit may further include a data input/output circuit connected to the driver circuit and the receiver circuit; and a memory cell array connected to the data input/output circuit. The memory cell array may include a plurality of cell strings arranged in a matrix of rows and columns on a substrate. Each of the cell strings may include a plurality of charge trap memory cells stacked on the substrate in a direction perpendicular to the substrate.

A storage device according to example embodiments of inventive concepts includes: a plurality of nonvolatile memory integrated circuits; a memory controller integrated circuit configured to control the nonvolatile memory integrated circuits; and an interface integrated circuit coupled between the nonvolatile memory integrated circuits and the memory controller integrated circuit and configured to mediate communication between the nonvolatile memory integrated circuits and the memory controller integrated circuit. The interface integrated circuit may be configured to output a termination code based on a signal received from each of the nonvolatile memory integrated circuits, and each of the nonvolatile memory integrated circuits may be configured to drive strengths of a pull-up driver and a pull-down driver to output a signal to the interface integrated circuit based on the termination code.

According to example embodiments of inventive concepts, pull-up drive strength and pull-down drive strength of a plurality of nonvolatile memory integrated circuits are adjusted using a ZQ calibration circuit provided in a memory controller integrated circuit or an interface integrated circuit. Since the nonvolatile memory integrated circuits adjusts pull-up drive strength and pull-down drive strength without the ZQ calibration circuit to achieve impedance matching, the manufacturing costs and sizes of a nonvolatile memory integrated circuit and a storage device including the nonvolatile memory integrated circuit are reduced.

According to example embodiments, an integrated circuit includes a first circuit (IC1) and a second circuit (IC2) configured to communicate with each other using a first communication structure of the IC1 and a second communication structure of the IC2. The IC1 includes a first core circuit and a first transceiver circuit. The IC2 includes a second transceiver circuit. The IC2 is configured to transfer a signal to the IC1. The IC1 is configured to generate a code from the signal and to transfer the code to the IC2 using the first core circuit, the first transceiver circuit, and the first and second communication structures. The second transceiver circuit is configured to adjust a drive strength according to the code transferred from the IC1 to the IC2.

In example embodiments, the first communication structure may be a first input/output pad. The second communication structure may be a second input/output pad. The first transceiver circuit may include a first pull-up resistor circuit and a first pull-down resistor circuit that are connected to the first input/output pad. The IC1 may be configured to perform a ZQ calibration function on the first transceiver circuit to adjust resistances of the first pull-up resistor circuit and the first pull-down resistor circuit using temperature information sensed from the first transceiver circuit. The IC2 may not be configured to perform the ZQ calibration function on the second transceiver circuit. The second transceiver circuit may be configured to adjust pull-up drive strength and pull-down drive strength according to the code transferred from the IC1 to the IC2.

In example embodiments, the first core circuit may be configured to detect a duty ratio of the signal transferred from the IC2 to the IC1.

In example embodiments, the first core circuit may be configured to detect a high level and low level of the signal transferred from the IC2 to the IC1.

In example embodiments, the IC2 may include a memory cell array. The memory cell array may include a plurality of memory cell strings. Each of the memory cell strings may include a plurality of memory cells stacked on top of each other in a vertical direction between a ground selection transistor and a string selection transistor.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. In the drawings:

FIG. 5 illustrates a first example in which an input signal received through a pad is output as a receive signal;

FIG. 6 illustrates a second example in which an input signal received through a pad is output as a receive signal;

FIG. 18 is a circuit diagram of a memory block according to example embodiments of inventive concepts.

DETAILED DESCRIPTION

Figure 1:
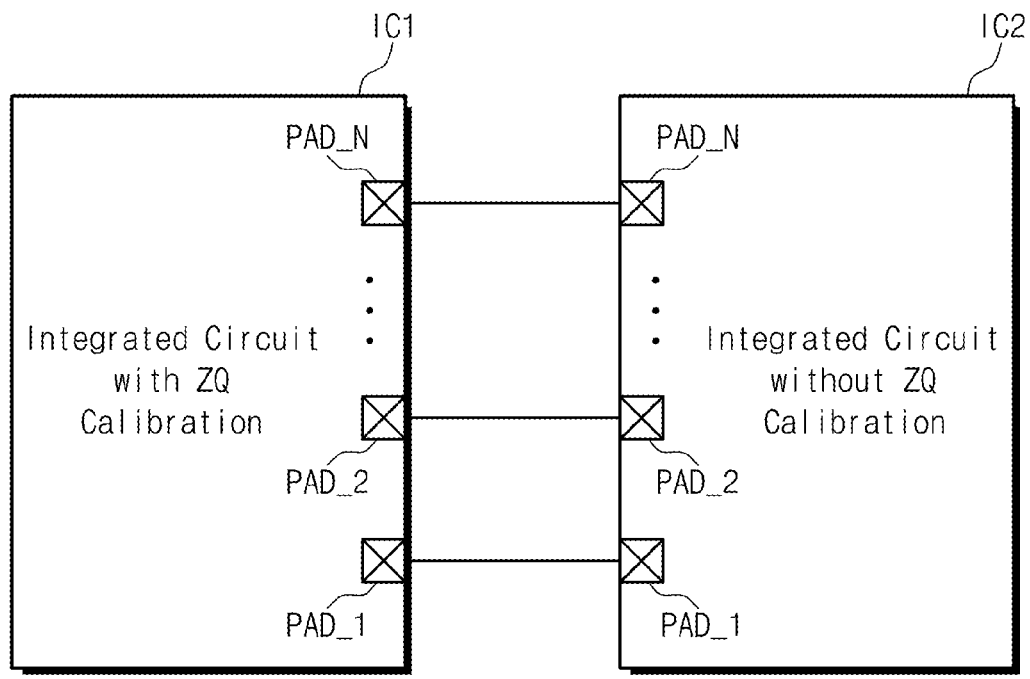
FIG. 1 is a block diagram of integrated circuits according to example embodiments of inventive concepts.

Example embodiments of inventive concepts will now be described more fully hereinafter with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of integrated circuits IC1 and IC2 according to example embodiments of inventive concepts. Referring to FIG. 1, a first integrated circuit IC1 and a second integrated circuit IC2 are configured to communicate with each other through first to Nth pads PAD_1 to PAD_N. The first integrated circuit IC1 has a ZQ calibration function to adjust resistances of an on-die termination circuit that limits and/or prevents reflection of a signal output through the first to Nth pads PAD_1 to PAD_N. The second integrated circuit IC2 does not have the ZQ calibration function and may adjust drive strength through interaction with the first integrated circuit IC1. An operation of adjusting the drive strength by the second integrated circuit IC2 may have an equivalent effect to the ZQ calibration operation. That is, the second integrated circuit IC2 may perform an equivalent operation to the ZQ calibration through the interaction with the first integrated circuit IC1 without including circuits for performing the ZQ calibration.

In example embodiments, the second integrated circuit IC2 may include a nonvolatile memory such as a NAND flash memory, a phase-change random access memory (PRAM), a magnetic RAM (MRAM), a ferroelectric RAM (FeRAM), and a resistive RAM (RRAM). The first integrated circuit IC1 may include a memory controller configured to control the second integrated circuit IC2.

In example embodiments, the first integrated circuit IC1 may constitute a single semiconductor chip. The second integrated circuit IC2 may constitute another single semiconductor chip. The first integrated circuit IC1 and the second integrated circuit IC2 may be provided to a single package as a multi-chip package (MCP). The first integrated circuit IC1 and the second integrated circuit IC2 may be provided to different packages and may constitute a package-on-package (PoP).

Figure 2:
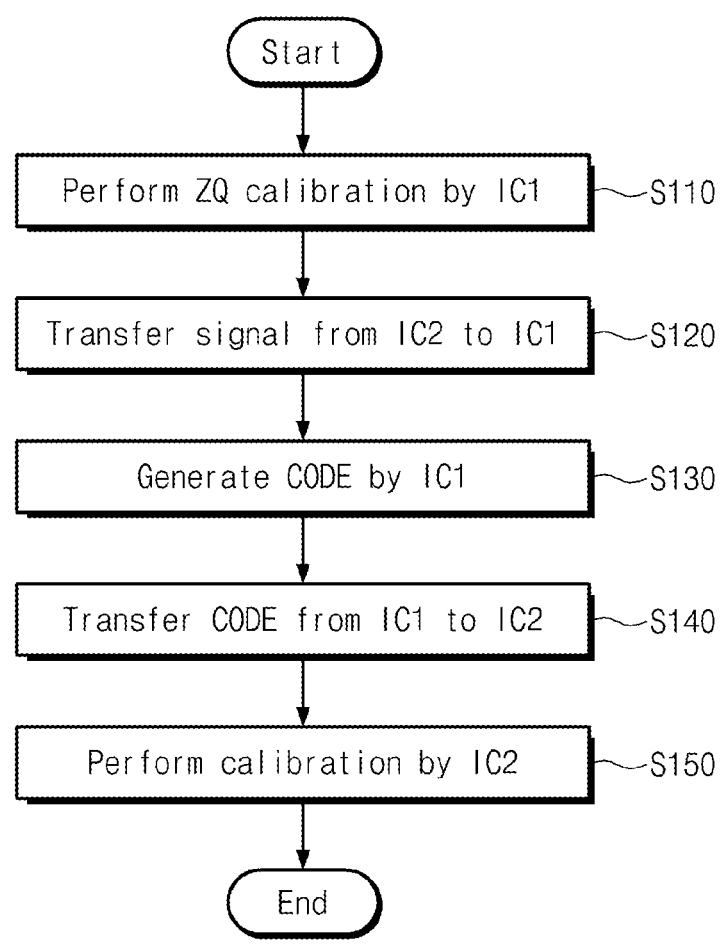
FIG. 2 is a flowchart summarizing an operating method of a first integrated circuit and a second integrated circuit.

FIG. 2 is a flowchart illustrating an operating method of the first integrated circuit IC1 and the second integrated circuit IC2. Referring to FIGS. 1 and 2, in an operation S110, the first integrated circuit IC1 performs ZQ calibration.

In an operation S120, the second integrated circuit IC2 transfers a signal to the first integrated circuit IC1. For example, the second integrated circuit IC2 may transfer a signal according to a request of the first integrated circuit IC1. The second integrated circuit IC2 may output a test signal having a desired (and/or alternatively predetermined) pattern or a test signal with repeated transition between a high level and a low level.

In an operation S130, the first integrated circuit IC1 generates a code CODE from the signal received from the second integrated circuit IC2. The code CODE may include information on characteristics of the signal that is transferred from the second integrated circuit IC2 and arrives at the first integrated circuit IC1.

In an operation S140, the first integrated circuit IC1 transfers the code CODE to the second integrated circuit IC2.

In an operation S150, the second integrated circuit IC2 performs calibration in response to the code CODE. For example, the second integrated circuit IC2 may adjust pull-up drive strength (e.g., adjust the pull-up drive strength to a new level that is higher or lower) and pull-down drive strength (e.g., adjust the pull-down strength of a new level that is higher or lower) in response to the code CODE. The calibration performed at the second integrated circuit in response to the code CODE may have the same effect as the ZQ calibration.

For example, the first integrated circuit IC1 may perform the ZQ calibration after entering a test mode. In the test mode, the first integrated circuit IC1 may generate a code CODE and transmit the generated code CODE to the second integrated circuit IC2 after the ZQ calibration is terminated.

For example, the second integrated circuit IC2 may enter the test mode according to a command or a control signal received from the first integrated circuit IC1. After entering the test mode, the second integrated circuit IC2 may output the test signal to the first integrated circuit IC1. In the test mode, the second integrated circuit IC2 may adjust pull-up drive strength and pull-down drive strength in response to the code CODE received from the first integrated circuit IC1. The second integrated circuit IC2 may terminate the test mode according to the command or the control signal received from the first integrated circuit IC1.

In example embodiments, when entering the test mode, the first integrated circuit IC1 may transfer the command or the control signal to the second integrated circuit IC2 to trigger the test mode. After the ZQ calibration is terminated at the first integrated circuit IC1 and before generation of the code CODE starts at the first integrated circuit IC1, the first integrated circuit IC1 may transfer the command or the control signal to the second integrated circuit IC2 to trigger the test mode.

Figure 3:
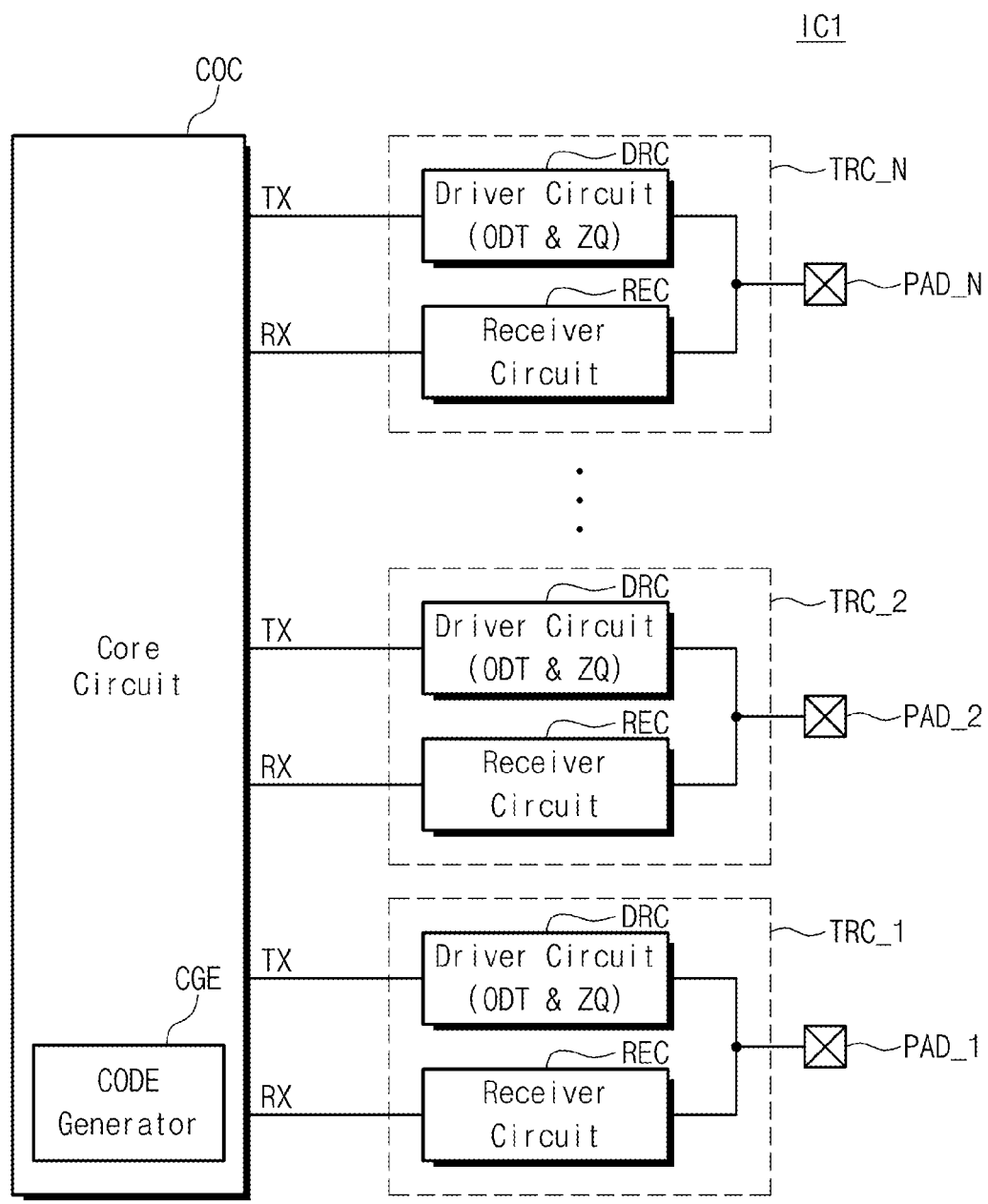
FIG. 3 is a block diagram illustrating an example of an integrated circuit to detect a code according to example embodiments of inventive concepts.

FIG. 3 is a block diagram illustrating an example of the first integrated circuit IC1 to detect a code CODE according to example embodiments of inventive concepts. As illustrated, the first integrated circuit IC1 includes first to Nth pads PAD_1 to PAD_N, first to Nth transceiver circuits TRC_1 to TRC_N, and a core circuit COC.

The first to Nth transceiver circuits TRC_1 to TRC_N are coupled between the core circuit COC and the first to Nth pads PAD_1 to PAD_N. Each of the first to Nth transceiver circuits TRC_1 to TRC_N may output an output signal through a corresponding one of the first to Nth pads PAD_1 to PAD_N in response to a transmit signal TX received from the core circuit COC. Each of the first to Nth transceiver circuits TRC_1 to TRC_N may transfer a receive signal RX to the core circuit COC in response to an input signal received from the corresponding one of the first to Nth pads PAD_1 to PAD_N.

Each of the first to Nth transceiver circuits TRC_1 to TRC_N includes a driver circuit DRC and a receiver circuit REC. The driver circuit DRC may generate an output signal output through a corresponding pad in response to a transmit signal TX received from the core circuit COC. The driver circuit DRC may be configured to perform an on-die termination (ODT) function and a ZQ calibration function. The receiver circuit REC may receive an input signal through a corresponding pad and output the received input signal as a receive signal RX.

The core circuit COC may transmit data to be transmitted to the second integrated circuit IC2 (see FIG. 1) to the first to Nth transceiver circuits TRC_1 to TRC_N as a transmit signal TX. The core circuit COC may receive the input signal transmitted to the first to Nth pads PAD_1 to PAD_N from the second integrated circuit IC2 through the first to Nth transceiver circuits TRC_1 to TRC_N as the receive signal RX.

The core circuit COC includes a code generator CGE. The code generator CGE is configured to detect a code CODE based on the receive signal RX of each of the first to Nth transceiver circuits TRC_1 to TRC_N. The code generator CGE may control the first integrated circuit IC1 to output the generated code CODE to the second integrated circuit IC2. For example, the code generator CGE may control some or all of the first to Nth transceiver circuits TRC_1 to TRC_N to output the code CODE to the second integrated circuit IC2 through some or all of the first to Nth pads PAD_1 to PAD_N. The code generator CGE may control the first integrated circuit IC1 to output the code CODE to the second integrated circuit IC2 through a separate channel.

In example embodiments, the code generator CGE may be provided as a part of the core circuit COC in the form of hardware. Alternatively, the code generator CGE may be provided as firmware driven at the core circuit COC. Alternatively, the code generator CGE may be a combination of hardware and software.

Figure 4:
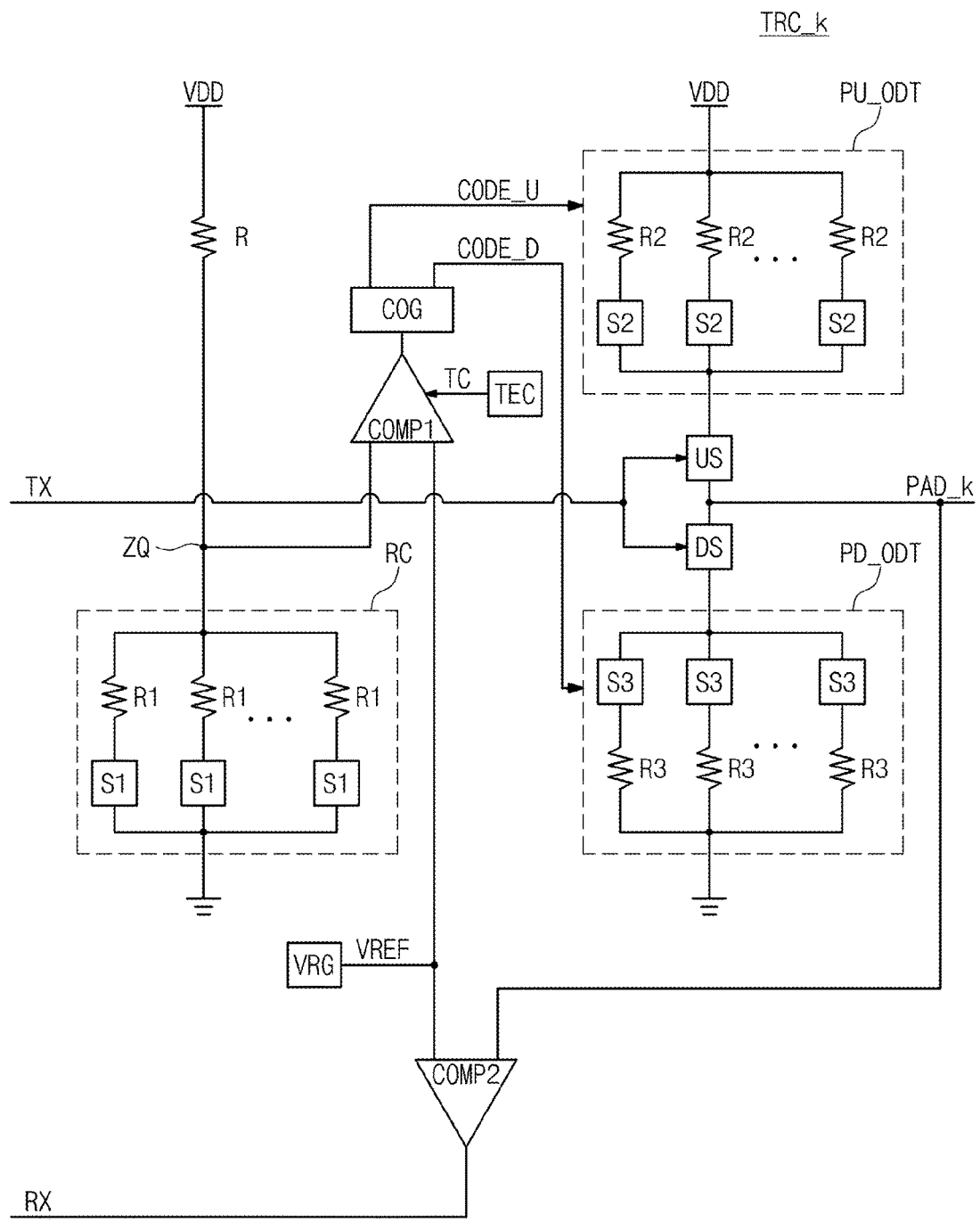
FIG. 4 illustrates an example of a transceiver circuit of the first integrated circuit.

FIG. 4 illustrates an example of a transceiver circuit TRC_k (k being a positive integer less than or equal to N) of the first integrated circuit IC1. Referring to FIGS. 3 and 4, the transceiver circuit TRC_k includes a resistor R, a resistor circuit RC, a reference voltage generator VRG, a temperature sensor TEC, a first comparator COMP1, a code generator COG, a pull-up resistor circuit PU_ODT, a pull-down resistor circuit PD_ODT, a pull-up switch US, a pull-down switch DS, and a second comparator COMP2.

The resistor R may be coupled between a node ZQ and a power supply node to which a power supply voltage VDD is supplied.

The resistor circuit RC is coupled between the node ZQ and a ground node to which a ground voltage is supplied. The resistor circuit RC includes a plurality of resistors R1 and a plurality of first switches S1 coupled in parallel between the node ZQ and the ground node. First terminals of the first resistors R1 may be commonly connected to the node ZQ. Second terminals of the first resistors R1 may be connected to first terminals of the first switches S1 respectively. Second terminals of the first switches S1 may be commonly connected to the ground node. A resistance of the resistor circuit RC may be adjusted depending on the number of turned-on switches or the number of turned-off switches among the first switches S1. For example, the resistor circuit RC may be adjusted to have a resistance that is equal to or proportional to the resistance of the resistor R. The resistance of the resistor circuit RC may be adjusted to be fixed on a wafer on which the first integrated circuit IC1 is formed. For example, the first switches S1 may be controlled by fuses such as laser fuses or electrical fuses.

The reference voltage generator VRG is configured to generate a reference voltage VREF. For example, the reference voltage generator VRG may be configured to divide a power supply voltage VDD and to output the divided voltage as a reference voltage VREF. The reference voltage generator VRG may be configured to adjust a level of the reference voltage VREF by adjusting a dividing rate of the power supply voltage VDD.

The temperature sensor TEC is configured to detect a temperature of the transceiver circuit TRC_k and to output temperature information TC according to a result of the detection. For example, the temperature sensor TEC may output information associated with a negative temperature coefficient (NTC) or a zero temperature coefficient (ZTC) as the temperature information TC.

The first comparator COMP1 is configured to receive a voltage of the node ZQ and the reference voltage VREF and compare the received voltage of the node ZQ and the received reference voltage VREF with each other. The first comparator COMP1 is configured to receive the temperature information TC and to apply the received temperature information TC as offset during the comparison.

The code generator COG may generate a pull-up code CODE_U and a pull-down code CODE_D from an output of the first comparator COMP1.

The pull-up resistor circuit PU_ODT is coupled between the power node to which the power supply voltage VDD is supplied and a first terminal of the pull-up switch US. The pull-up resistor circuit PU_ODT includes a plurality of second resistors R2 and a plurality of second switches S2 coupled in parallel between the power supply node and the first terminal of the pull-up switch US. Second terminals of the second switches S2 may be commonly connected to the first terminal of the pull-up switch US. A resistance of the pull-up resistor circuit PU_ODT is adjusted depending on the number of turned-on switches or turned-off switches among the second switches S2. The second switches S2 may be controlled by the pull-up code CODE_U. For example, each of the second switches S2 may be turned on or off in response to the pull-up code CODE_U.

The pull-down resistor circuit PD_ODT is coupled between the ground node to which the ground voltage VSS is supplied and a first terminal of the pull-down switch DS. The pull-down resistor circuit PD_ODT includes a plurality of third resistors R3 and a plurality of third switches S3 coupled in parallel between the ground node and the first terminal of the pull-down switch DS. First terminals of the third resistors R3 may be commonly connected to the ground node. Second terminals of the third resistors R3 may be commonly connected to the first terminal of the pull-down switch DS. A resistance of the pull-down resistor circuit PD_ODT is adjusted depending on the number of turned-on switches or turned-off switches among the third switches S3. The third switches S3 may be controlled by the pull-down code CODE_D. For example, each of the third switches S3 may be turned on or off in response to the pull-down code CODE_D.

The first terminal of the pull-up switch US is connected to the pull-up resistor circuit PU_ODT. A gate of the pull-up switch US is connected to a gate of the pull-down switch DS and receives a transmit signal TX. A second terminal of the pull-up switch US is connected to the second terminal of the pull-down switch DS and connected to the pad PAD_k.

The second comparator COMP2 may compare the reference voltage and a voltage of the pad PAD_k with each other. The second comparator COMP2 may output a result of the comparison as a receive signal RX. The second comparator COMP2 may constitute a receiver circuit REC.

The resistor R, the resistor circuit RC, the temperature sensor TEC, the first comparator COMP1, the code generator COG, the pull-up resistor circuit PU_ODT, the pull-down resistor circuit PD_ODT, the pull-up switch US, and the pull-down switch DS may constitute the driver circuit DRC.

When the transceiver circuit TRC_k outputs an output signal through the pad PAD_k, one of the pull-up switch US and the pull-down switch DS may be turned on and the other may be turned off in response to the transmit signal TX. When the pull-up switch US is turned on and the pull-down switch DS is turned off, a high-level signal may be output through the pad PAD_k. When the pull-up switch US is turned off and the pull-down switch DS is turned on, a low-level signal may be output through the pad PAD_k.

When the transceiver circuit TRC_k receives an input signal through the pad PAD_k, both the pull-up switch US and the pull-down switch DS may be turned on. As both the pull-up switch US and the pull-down switch DS are turned on, on-chip termination (ODT) may be performed by the pull-up resistor circuit PU_ODT and the pull-down resistor circuit PD_ODT.

In a test mode, ZQ calibration may be performed and the code CODE of the transceiver circuit TRC_k may be generated. The ZQ calibration may be an operation to decide a resistance of the pull-up resistor circuit PU_ODT and a resistance of the pull-down resistor circuit PD_ODT. When the ZQ calibration is performed, the pull-up resistor circuit PU_ODT and the pull-down resistor circuit PD_ODT may have the same resistance or resistances according to a desired (and/or alternatively predetermined) ratio.

In the test mode, the code CODE is generated after the resistances of the pull-up resistor circuit PU_ODT and the pull-down resistor circuit PD_ODT are decided. For example, both the pull-up switch US and the pull-down switch DS are turned on to perform the on-die termination (ODT) by the pull-up resistor circuit PU_ODT and the pull-down resistor circuit PD_ODT. The second comparator COMP2 may compare an input signal received from the second integrated circuit IC2 through the pad PAD_k with the reference voltage VREF and output a result of the comparison as a receive signal. The code generator CGE may generate a code CODE according to characteristics of the receive signal RX.

FIG. 5 illustrates a first example in which an input signal received through a pad PAD_k is output as a receive signal RX. In FIG. 5, a horizontal axis represents time and a vertical axis represents a voltage level. In FIG. 5, an input signal is shown in a first graph G1 and the receive signal RX is shown in a second graph G2.

Referring to FIG. 4 and the graph G1 in FIG. 5, an input signal may be a signal that periodically swings between a high level and a low level. A central level of the swing of the input signal may be higher than a level of the reference signal VREF.

The second comparator COMP2 may output a result of comparison between the reference voltage VREF and the input signal as a receive signal RX. Thus, the receive signal RX may have the same waveform as the input signal, as shown in the second graph G2 in FIG. 5. A relative position of the reference voltage VREF to the swing level of the input signal may be identical to that of the ground voltage VSS to the swing level of the receive signal RX.

The code generator CGE may be configured to detect a duty ratio of the receive signal RX or a difference between a magnitude of a high level and a magnitude of a low level of the receive signal RX. When the receive signal RX has a duty ratio of 50 percent or a first magnitude V1 of the high level and a second magnitude V2 of the low level of the receive signal RX are equal to each other, a discrimination margin of the receive signal RX increases. For example, accuracy to discriminate whether the receive signal RX has the low level or the high level is improved.

In FIG. 5, a first interval INT1 in which the receive signal RX has the high level is longer than a second interval INT2 in which the receive signal RX has the low level. The magnitude V1 of the high level of the receive signal RX is greater than the magnitude V2 of the low level of the receive signal RX. Thus, the code generator CGE may generate information to indicate that the first interval INT1 is longer than the second interval INT2, information to indicate that the first interval INT1 needs to decrease or the second interval INT2 needs to increase, information to indicate that the first magnitude V1 is greater than the second magnitude V2, information to indicate whether the first magnitude V1 needs to decrease or the second magnitude V2 needs to increase, or information to indicate that pull-down intensity needs to increase, as a code CODE.

FIG. 6 illustrates a second example in which an input signal received through a pad PAD_k is output as a receive signal RX. In FIG. 6, a horizontal axis represents time and a vertical axis represents a voltage level. In FIG. 6, an input signal is shown in a first graph G1 and the receive signal RX is shown in a second graph G2.

Referring to FIG. 4 and the graph G1 in FIG. 6, an input signal may be a signal that periodically swings between a high level and a low level. A central level of the swing of the input signal may be lower than a level of the reference voltage VREF.

The second comparator COMP2 outputs a result of comparison between the reference voltage VREF and the input signal. Thus, the receive signal RX has the same waveform as the input signal. A relative position of the reference voltage VREF to the swing level of the input signal may be identical to a relative position of the ground voltage VSS to the swing level of the receive signal RX.

In FIG. 6, a first interval INT1 in which the receive signal RX has the high level is shorter than a second interval INT2 in which the receive signal RX has the low level. The magnitude V1 of the high level of the receive signal RX is smaller than the magnitude V2 of the low level of the receive signal RX. Thus, the code generator CGE may generate information to indicate that the first interval INT1 is shorter than the second interval INT2, information to indicate that the first interval INT1 needs to increase or the second interval INT2 needs to decrease, information to indicate that the first magnitude V1 is smaller than the second magnitude V2, information to indicate whether the first magnitude V1 needs to increase or the second magnitude V2 needs to decrease, or information to indicate that pull-up intensity needs to increase, as a code CODE.

Figure 7:
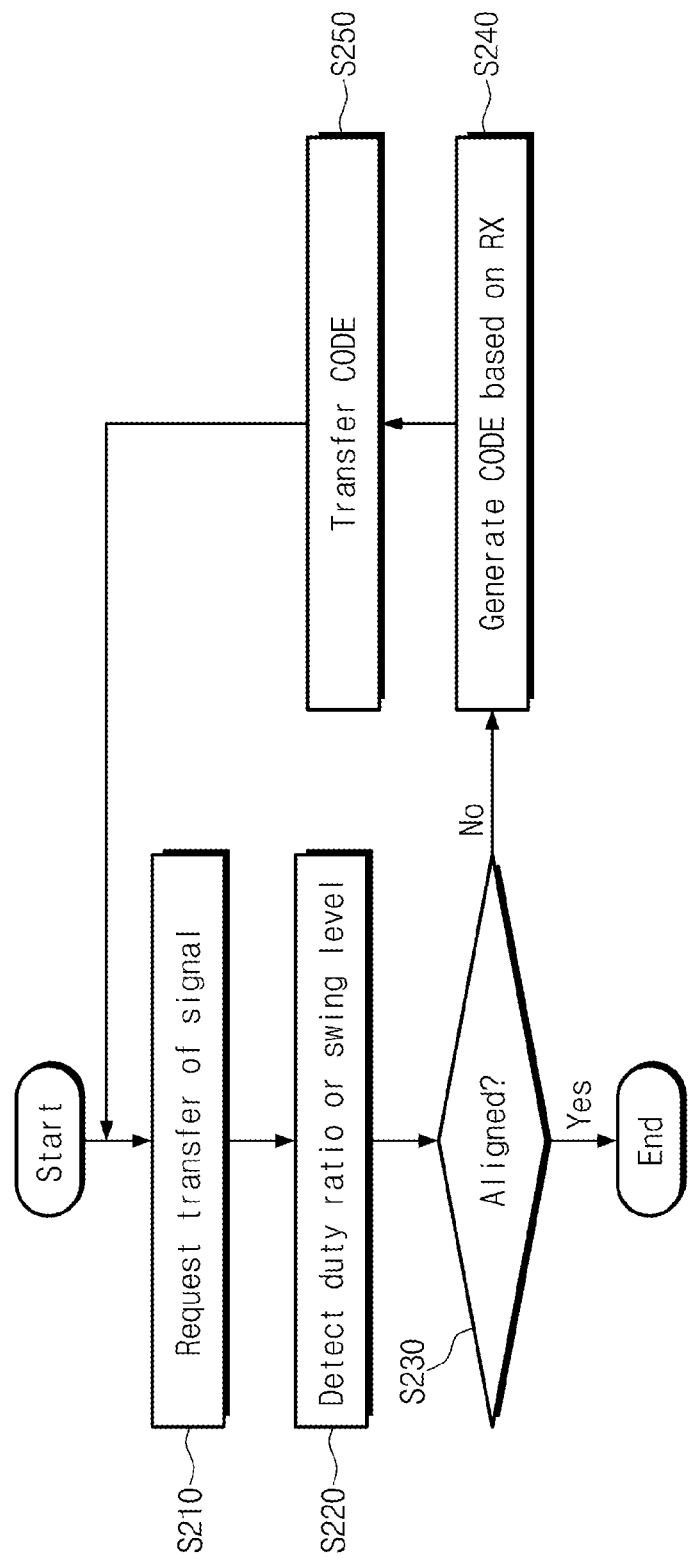
FIG. 7 is a flowchart summarizing an operating method of a first integrated circuit according to example embodiments of inventive concepts.

FIG. 7 is a flowchart summarizing an operating method of the first integrated circuit IC1 according to example embodiments of inventive concepts. Referring to FIGS. 1, 3, 4, and 7, in an operation S210, the first integrated circuit IC1 may transfer a signal to the second integrated circuit IC2. For example, the first integrated circuit IC1 may transfer a signal through some or all of the first to Nth pads PAD_1 to PAD_N or a separate channel to request that the second integrated circuit IC2 transfer the signal. In a test mode, the first integrated circuit IC1 may request transfer of the signal after ZQ calibration is terminated. The first integrated circuit IC1 may request the second integrated circuit IC2 to output a test signal having a desired (and/or alternatively predetermined) pattern or a test signal that periodically transitions between a high level and a low level.

In an operation S220, the first integrated circuit IC detects a duty ratio or a swing level of the receive signal RX. For example, the code generator CGE may detect the duty ratio or the swing level of the receive signal RX and generate a code CODE according to a result of the detection.

In an operation S230, the first integrated circuit IC1 determines whether the receive signal RX is aligned. For example, the first integrated circuit IC1 may determine that the receive signal RX is aligned when the duty ratio of the receive signal RX is 50 percent or has a difference in less than a first critical value from 50 percent. For example, the first integrated circuit IC1 may determine that the receive signal RX is aligned when a magnitude of a high level and a magnitude of a low level of the receive signal RX are equal to each other or a difference between the high level and the low level of the receive signal RX is no more than a second critical value. For example, the operation S230 may be performed by the code generator CGE or the core circuit COC.

When the receive signal RX is not aligned, the flow proceeds to an operation S240 in which the code generator CGE may generate a code CODE based on the receive signal RX. For example, the code generator CGE may generate a code CODE including information on an alignment state of the receive signal RX. In an operation S250, the code generator CGE may control the first integrated circuit IC1 to transfer the generated code CODE to the second integrated circuit IC2. When the receive signal RX is aligned, the test mode may come to an end.

Figure 8:
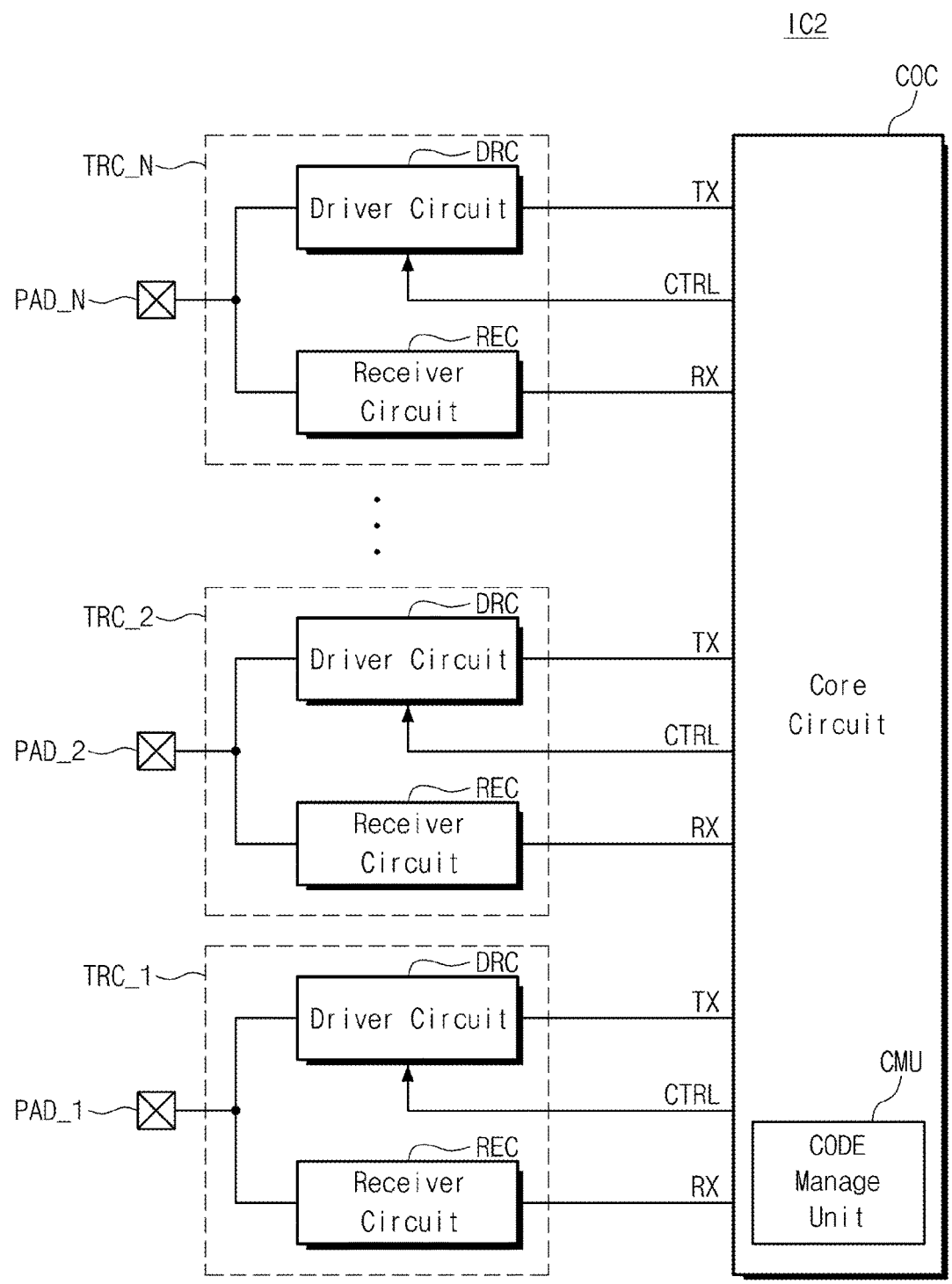
FIG. 8 is a block diagram illustrating an example of a second integrated circuit to adjust drive strength according to example embodiments of inventive concepts.

FIG. 8 is a block diagram illustrating an example of a second integrated circuit IC2 to adjust drive strength according to example embodiments of inventive concepts. As illustrated, the second integrated circuit IC2 includes first to Nth pads PAD_1 to PAD_N, first to Nth transceiver circuits TRC_1 to TRC_N, and a core circuit COC.

The first to Nth transceiver circuits TRC_1 to TRC_N are coupled between the core circuit COC and the first to Nth pads PAD_1 to PAD_N. Each of the first to Nth transceiver circuits TRC_1 to TRC_N may output an output signal through a corresponding one of the first to Nth pads PAD_1 to PAD_N in response to a transmit signal TX received from the core circuit COC. Each of the first to Nth transceiver circuits TRC_1 to TRC_N may transfer the transmit signal RX to the core circuit COC in response to an input signal received from a corresponding one of the first to Nth pads PAD_1 to PAD_N.

Each of the first to Nth transceiver circuits TRC_1 to TRC_N includes a driver circuit DRC and a receiver circuit REC. The driver circuit DRC may generate an output signal output through a corresponding pad in response to the transmit signal TX received from the core circuit COC. The driver circuit DRC is configured to adjust drive strength in response to a control signal CTRL. For example, the driver circuit may control pull-up drive strength which drives a voltage of a pad PAD to a high level or pull-down drive strength which drives the voltage of the pad PAD to a low level. The receiver circuit REC may receive an input signal through a corresponding pad and output the received input signal as a receive signal RX.

The core circuit COC may transfer data to be transferred to the first integrated circuit IC1 (see FIG. 1) to the first to Nth transceiver circuits TRC_1 to TRC_N as transmit signals TX. The core circuit COC may receive an input signals transferred from the first integrated circuit IC1 to the first to Nth pads PAD_1 to PAD_N through the first to Nth transceiver circuits TRC_1 to TRC_N as the receive signals RX.

The core circuit COC includes a code manage unit CMU. The code manage unit CMU may control the first to Nth transceiver circuits TRC_1 to TRC_N to output a test signal according to a request of the first integrated circuit IC1 in a test mode. The code manage unit CMU may store the code CODE received from the first integrated circuit IC1 in the test mode. The code manage unit CMU may output the control signal CTRL to each of the first to Nth transceiver circuits TRC_1 to TRC_N using the stored code CODE.

In example embodiments, the code manage unit CMU may be provided as a part of the core circuit COC in the form of hardware. Alternatively, the code manage unit CMU may be provided as firmware driven at the core circuit COC.

Figure 9:
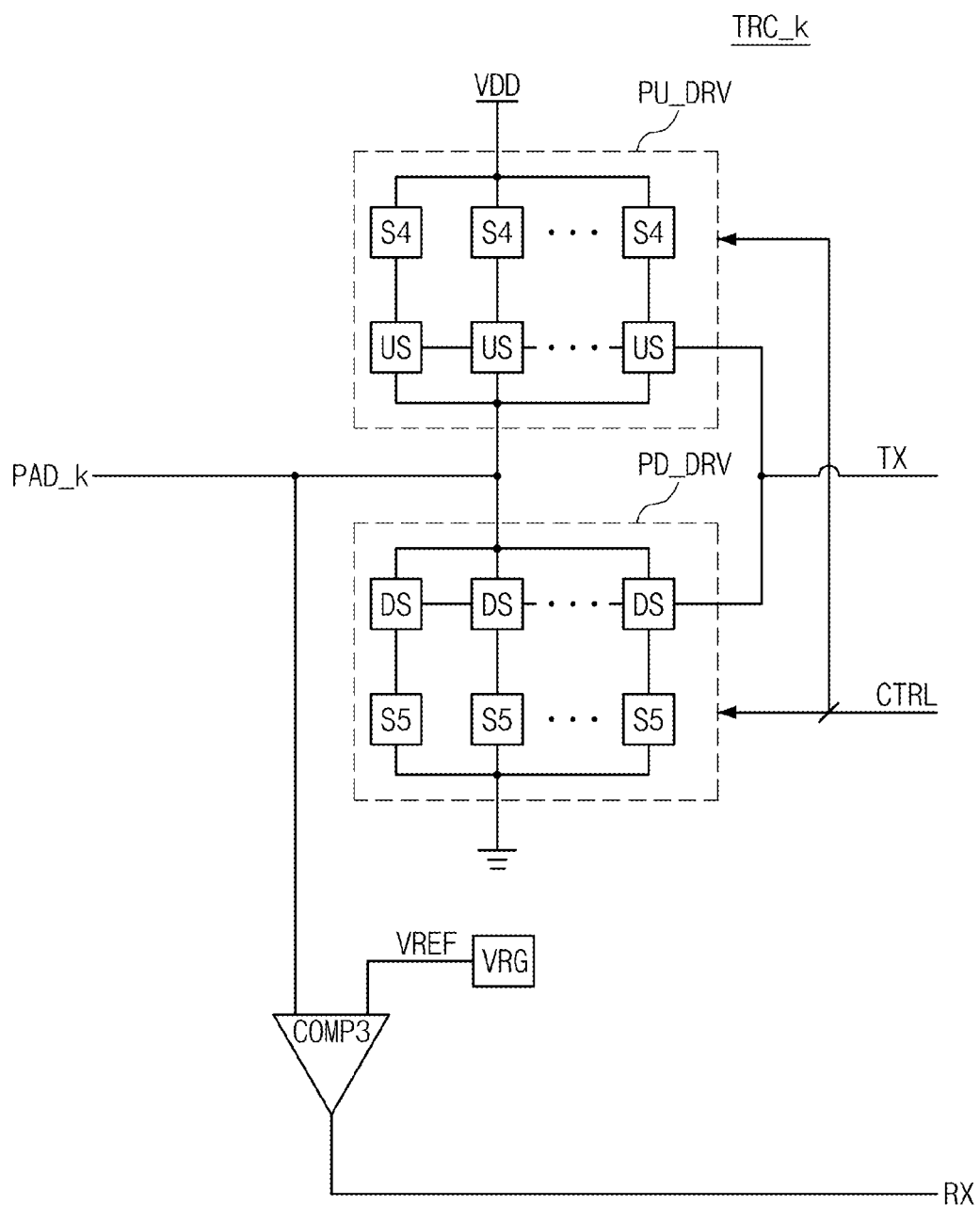
FIG. 9 illustrates an example of a transceiver circuit of the second integrated circuit.

FIG. 9 illustrates an example of a transceiver circuit TRC_k of the second integrated circuit IC2. As illustrated in FIGS. 8 and 9, the transceiver circuit TRC_k includes a pull-up driver PU_DRV, a pull-down driver PD_DRV, a reference voltage generator VRG, and a third comparator COMP3.

The pull-up driver PU_DRV is coupled between a pad PAD_k and a power supply node to which a power supply voltage VDD is supplied. The pull-up driver PU_DRV includes a plurality of pull-up switches US and a plurality of fourth switches S4 coupled in parallel between the pad PAD_k and the power supply node. First terminals of the fourth switches S4 may be commonly connected to the power supply node. Second terminals of the fourth switches S4 may be connected to first terminals of the pull-up switches US. Second terminals of the pull-up switches US may be commonly connected to the pad PAD_k.

The pull-up switches US are configured to be simultaneously turned on or off according to a level of a transmit signal TX. The number of current paths between the pad PAD_k and the power supply node is adjusted depending on the number of turned-on or turned-off switches among the fourth switches S4. That is, pull-up drive strength of the pull-up driver PU_DRV is adjusted. The fourth switches S4 may be controlled according to a signal associated with the pull-up drive strength among the control signal CTRL transferred from the core circuit COC. For example, each of the fourth switches S4 may be turned on or off in response to the control signal CTRL.

The pull-down driver PD_DRV is coupled between the pad PAD_k and a ground node to which a ground voltage VSS is supplied. The pull-down driver PD_DRV includes a plurality of pull-down switches DS and a plurality of fifth switches S5 coupled in parallel between the pad PAD_k and the ground node. First terminals of the fifth switches S5 may be commonly connected to the ground node. Second terminals of the fifth switches S5 may be connected to first terminals of the pull-down switches DS. Second terminals of the pull-down switches DS may be commonly connected to the pad PAD_k.

The pull-down switches DS are configured to be simultaneously turned on or off according to a level of the transmit signal TX. The number of current paths between the pad PAD_k and the ground node is adjusted depending on the number of turned-on or turned off switches among the fifth switches S5. That is, pull-down drive strength of the pull-down driver PD_DRV is adjusted. The fifth switches S5 may be controlled according to a signal associated with the pull-down drive strength among the control signal CTRL transferred from the core circuit COC. For example, each of the fifth switches S5 may be turned on or off in response to the control signal CTRL.

The reference voltage generator VRG is configured to generate a reference voltage VREF. For example, the reference voltage generator VRG may be configured to divide a power supply voltage VDD and to output the divided voltage as the reference voltage VREF. The reference voltage generator VRG may be configured to adjust a level of the reference voltage VREF by adjusting a dividing rate of the power supply voltage VDD.

The third comparator COMP3 is configured to compare a voltage of the pad PAD_k and the reference voltage VREF with each other and to output a result of the comparison as a receive signal RX. The third comparator COMP3 may constitute a receiver circuit REC.

The pull-up driver PU_DRV and the pull-down driver PD_DRV may constitute a driver circuit DRC.

When the transceiver circuit TRC_k outputs an output signal through the pad PAD_k, ones of the pull-up switches US and the pull-down switches DS may be turned on and other ones may be turned off in response to the transmit signal TX. When the pull-up switches US are turned on and the pull-down switches DS are turned off, a high-level signal may be output through the pad PAD_k. When the pull-up switches US are turned off and the pull-down switches DS are turned on, a low-level signal may be output through the pad PAD_k. When the number of activated switches among the fourth switches S4 is adjusted by the control signal CTRL, pull-up drive strength of the driver circuit DRC may be adjusted. When the number of activated switches among the fifth switches S5 is adjusted by the control signal CTRL, pull-down strength of the driver circuit DRC may be adjusted.

When the transceiver circuit TRC_k receives an input signal through the pad PAD_k, both the pull-up switches US and the pull-down switches may be turned on. As both the pull-up switches US and the pull-down switches DS are turned on, the pull-up switches US acts as a resistance element coupled between the fourth switches S4 and the pad PAD_k and the pull-down switches DS acts as a resistance element coupled between the fifth switches S5 and the pad PAD_k. When the number of activated switches among the fourth switches S4 and the fifth switches S5 is adjusted, a pull-up resistance element between the pad PAD_k and the power supply node and a pull-down resistance element between the pad PAD_k and the ground node are adjusted. In example embodiments, when the receive signal RX of the first integrated circuit IC1 is aligned (see FIG. 7), on-die termination (ODT) may be accomplished by the pull-up resistance element of the pull-up driver PU_DRV and the pull-down resistance element of the pull-down driver PD_DRV.

In FIG. 4, it is shown that each of the pull-up and pull-down switches US and DS is a single switch. However, as described with reference to FIG. 9, the pull-up switch US in FIG. 4 may have a similar structure to the pull-up driver PU_DRV and the pull-down switch DS in FIG. 4 may have a similar structure to the pull-down driver PD_DRV. That is, in FIG. 4, pull-up drive strength and pull-down drive strength of the pull-up switch US and the pull-down switch DS may be adjusted, respectively.

Figure 10:
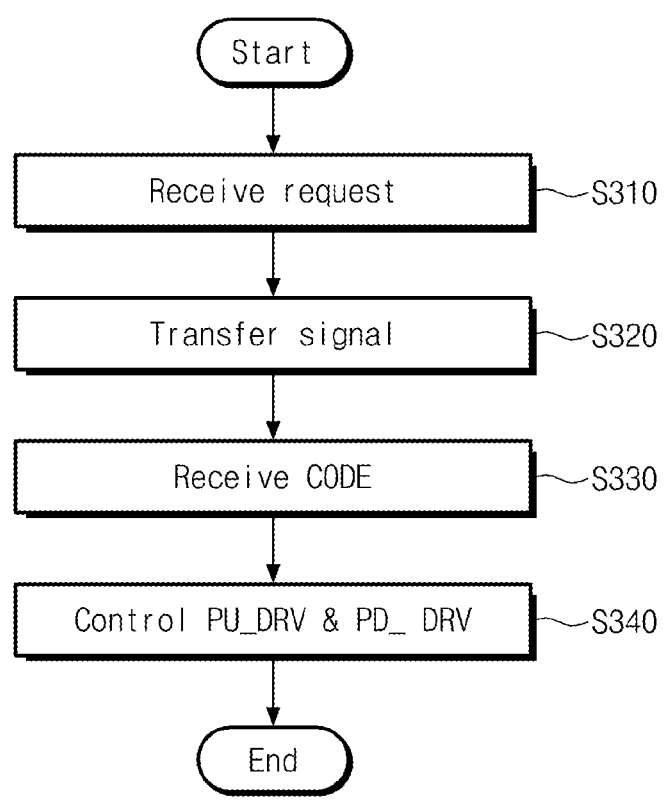
FIG. 10 is a flowchart summarizing an operating method of the second integrated circuit according to example embodiments of inventive concepts.

FIG. 10 is a flowchart illustrating an operating method of the second integrated circuit IC2 according to example embodiments of inventive concepts. Referring to FIG. 1 and FIGS. 8 to 10, in an operation S310, the second integrated circuit IC2 receives a request from the first integrated circuit IC1. For example, the second integrated circuit IC2 may receive a transfer request of a test signal from the first integrated circuit IC1.

In an operation S320, the second integrated circuit IC2 transfers a signal. For example, the second integrated circuit IC2 may output a test signal having a desired (and/or alternatively predetermined) pattern or a test signal having a pattern that periodically swings between a high level and a low level, to the first integrated circuit IC1 through at least one of the first to Nth pads PAD_1 to PAD_N.

In an operation S330, the second integrated circuit IC2 receives a code CODE. For example, the second integrated circuit IC2 may receive the code CODE through some or all of the first to Nth pads PAD_1 to PAD_N or a separate channel.

In an operation S340, the second integrated circuit IC2 may control the pull-up driver PU_DRV or the pull-down driver PD_DRV in response to the received code CODE. For example, the second integrated circuit IC2 may control pull-up drive strength of the pull-up driver PU_DRV and pull-down drive strength of the pull-down driver PD_DRV. As the pull-up drive strength and the pull-down drive strength are adjusted, pull-up resistances and pull-down resistances associated with on-die termination (ODT) performed by the pull-up driver PU_DRV and the pull-down driver PD_DRV are adjusted. That is, although circuits associated with ZQ calibration are not provided at the second integrated circuit IC2 and the ZQ calibration is not performed at the second integrated circuit IC2, an equivalent effect is obtained at the second integrated circuit IC2 as if the ZQ calibration occurs at the second integrated circuit IC2.

Figure 11:
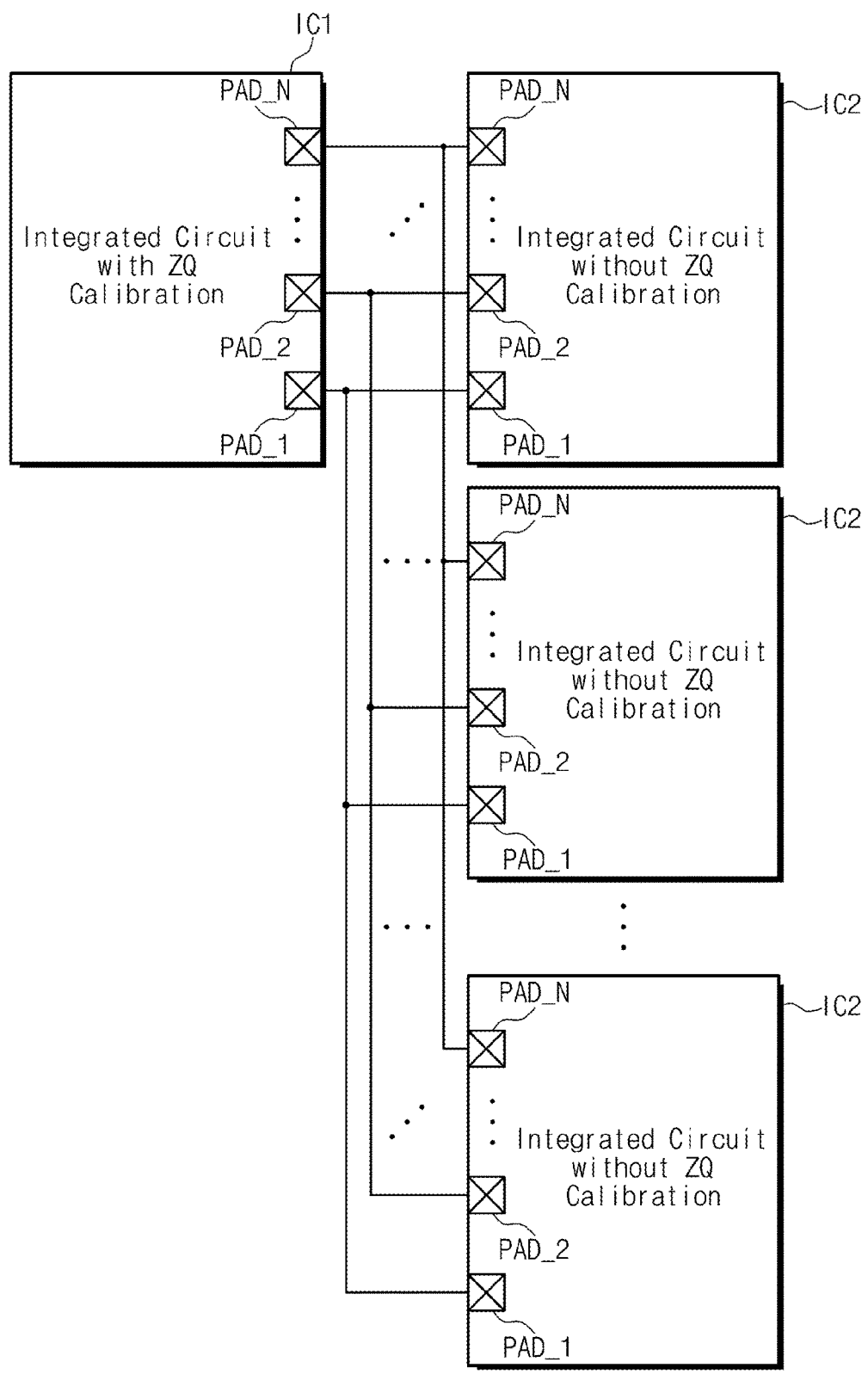
FIG. 11 illustrates another example in which a first integrated circuit and a plurality of second integrated circuits are connected.

FIG. 11 illustrates another example in which a first integrated circuit IC1 and a plurality of second integrated circuits IC2 are connected. As illustrated, the second integrated circuits IC2 may be commonly connected to the first integrated circuit IC1. For example, first pads PAD_1 of the second integrated circuit IC2 may be commonly connected to first pads PAD_1 of the first integrated circuit IC1. Also kth pads PAD_k (k being a positive integer) of the second integrated circuits IC2 may be commonly connected to a kth pad PAD_k of the first integrated circuit IC. Also Nth pads PAD_N of the second integrated circuits may be commonly connected to an Nth pad PAD_N of the first integrated circuit IC1.

The first integrated circuit IC1 may activate or deactivate the second integrated circuits IC2 through separate signal lines (not shown) that are provided to the second integrated circuits IC2, respectively. The first integrated circuit IC1 may transfer an output signal to an activated one of the second integrated circuits IC2 through the first to Nth pads PAD_1 to PAD_N and receive an input signal from the activated integrated circuit.

The first integrated circuit IC1 may have the structure described with reference to FIGS. 3 and 4. Each of the second integrated circuits IC2 may have the structure described with reference to FIGS. 8 and 9. That is, the first integrated circuit IC1 may perform ZQ calibration and generate codes CODE respectively corresponding to the second integrated circuits IC2 using a test signal transferred from the second integrated circuits IC2. Each of the second integrated circuits IC2 may adjust pull-up drive strength and pull-down drive strength according to a corresponding code.

Figure 12:
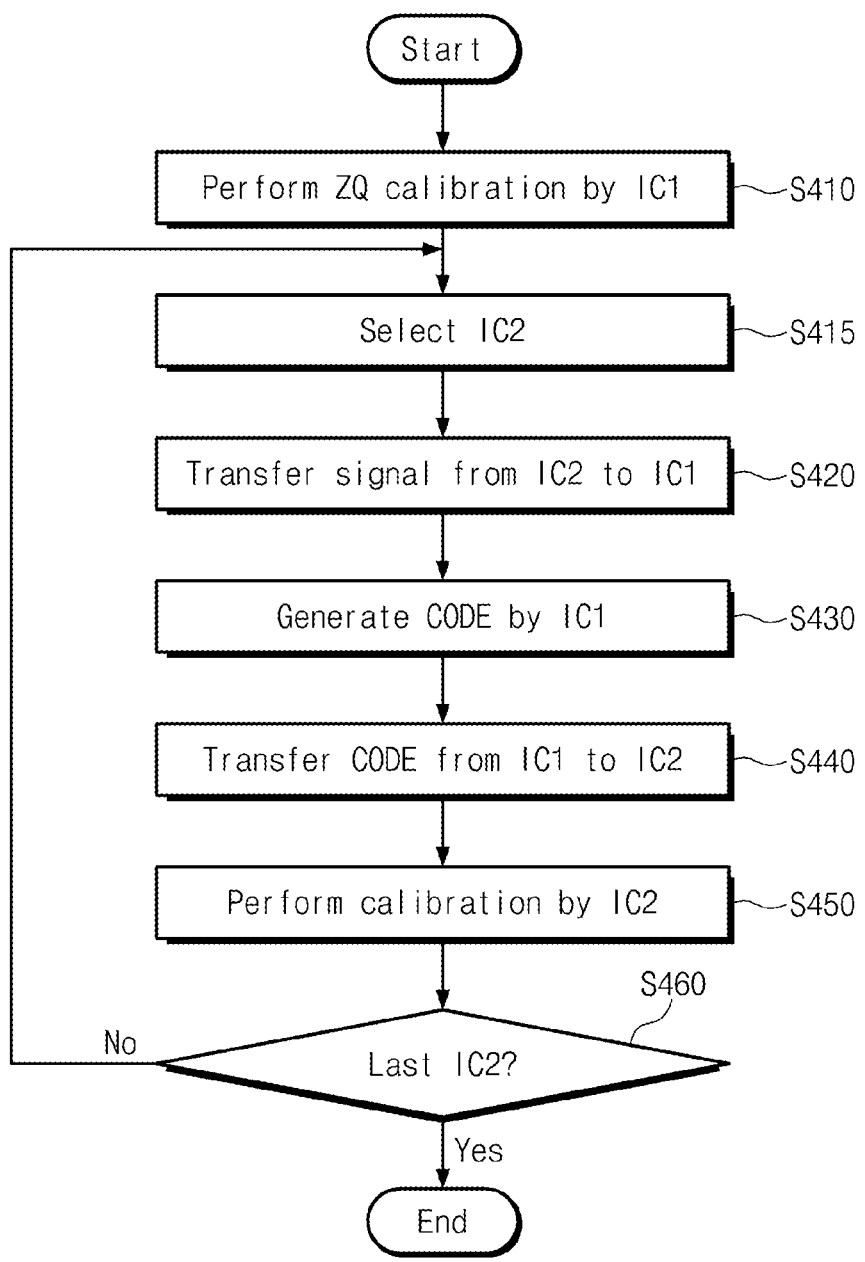
FIG. 12 is a flowchart summarizing an example of an operating method of the first integrated circuit and the plurality of second integrated circuits are connected.

FIG. 12 is a flowchart summarizing an example of an operating method of the first integrated circuit IC1 and the plurality of second integrated circuits IC2 are connected. Referring to FIGS. 11 and 12, in an operation S410, the first integrated circuit IC1 performs ZQ calibration.

In an operation S415, the first integrated circuit IC1 selects one of the second integrated circuits IC2. For example, the first integrated circuit IC1 may activate one of the second integrated circuits IC2.

In an operation S420, the activated second integrated circuit IC2 may transfer a test signal to the first integrated circuit IC1.

In an operation S430, the first integrated circuit IC1 may generate a code CODE from the test signal received from the activated second integrated circuit IC2.

In an operation S440, the first integrated circuit IC1 may transfer the generated code CODE to the activated second integrated circuit IC2.

In an operation S450, the activated second integrated circuit IC2 may perform calibration in response to the code CODE. For example, the activated second integrated circuit IC2 may adjust pull-up intensity and pull-down intensity in response to the code CODE.

When the calibration of the activated second integrated circuit IC2 is terminated, the flow proceeds to an operation S460 in which the first integrated circuit IC1 determines whether the selected second integrated circuit IC2 is a last second integrated circuit IC2. For example, the first integrated circuit IC1 may determine whether calibration is performed at all the second integrated circuit IC2. When the selected second integrated circuit IC2 is the last second integrated circuit IC2, a test operation is completed. When the selected second integrated circuit IC2 is not the last second integrated circuit IC2, the flow proceeds to an operation S415 in which the next second integrated circuit IC2 is selected.

For example, the first integrated circuit IC1 may perform ZQ calibration after entering the test mode. In the test mode, after the ZQ calibration is terminated, the first integrated circuit IC1 may activate a first one of the second integrated circuits IC2, generate a code CODE of the activated second integrated circuit IC2, and transfer the generated code CODE to the activated second integrated circuit IC2.

For example, the activated second integrated circuit IC2 may enter the test mode according to a command or a control signal received from the first integrated circuit IC1. After entering the test mode, the activated second integrated circuit IC2 may output the test signal to the first integrated circuit IC1 according to a request of the first integrated circuit IC1. Moreover, in the test mode, the activated second integrated circuit IC2 may adjust pull-up drive strength and pull-down drive strength in response to the code CODE received from the first integrated circuit IC1. The activated second integrated circuit IC2 may terminate the test mode according to the command or the control signal received from the first integrated circuit IC2.

In example embodiments, when the first integrated circuit IC1 enters the test mode, the first integrated circuit IC1 may transfer the command or the control signal to the activated second integrated circuit IC2 to trigger the test mode. In this case, the operation S415 may be performed prior to the operation S410. Alternatively, after the ZQ calibration is terminated at the first integrated circuit IC1 and before starting to generate the code CODE, the first integrated circuit IC1 may transfer the command or the control signal to the activated second integrated circuit IC2 to trigger the test mode.

According to example embodiments of inventive concepts, the first integrated circuit IC1 has a function to generate a code CODE. Thus, circuits and functions associated with ZQ calibration may be removed from a plurality of integrated circuits IC2 to reduce size, complexity, and manufacturing cost of the integrated circuits IC2.

Figure 13:
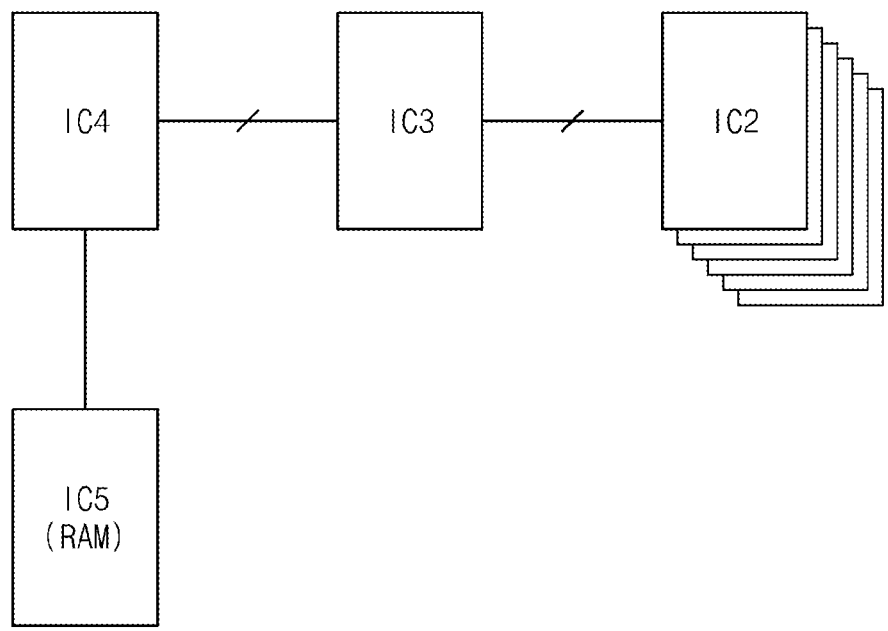
FIG. 13 is a block diagram of integrated circuits according to example embodiments of inventive concepts.

FIG. 13 is a block diagram of integrated circuits IC2 to IC4 according to example embodiments of inventive concepts. Referring to FIG. 13, a fourth integrated circuit IC4 is configured to communicate with a third integrated circuit IC3 and a fifth integrated circuit IC5. The third integrated circuit IC3 is configured to communicate with a plurality of second integrated circuits IC2 and a fourth integrated circuit IC4. The second integrated circuits IC2 are configured to communicate with the third integrated circuit IC3.

In example embodiments, each of the second integrated circuits IC2 may have the structure described with reference to FIGS. 8 and 9. That is, each of the second integrated circuits IC2 is configured to adjust pull-up drive strength and pull-down drive strength in response to the code CODE. Each of the second integrated circuits IC2 may include a nonvolatile memory.

The fourth integrated circuit IC4 may be a memory controller configured to control the second integrated circuits IC2.

The third integrated circuit IC3 is configured to mediate communication between the fourth integrated circuit IC4 and the second integrated circuit IC2. For example, the third integrated circuit IC3 is configured to transfer a signal output from the fourth integrated circuit IC4 to the second integrated circuit IC2 and to transfer a signal transferred from the second integrated circuit IC2 to the fourth integrated circuit IC4. The third integrated circuit IC3 may be configured such that retiming is performed to realign synchronization of a clock and a signal during the signal transfer.

The fifth integrated circuit IC5 may be a random access memory (RAM) used as a buffer memory, a cache memory, and a working memory by a memory controller.

The second to fifth integrated circuits IC2 to IC5 may be implemented with separate packages, respectively. At least two of the second to fifth integrated circuits IC2 to IC5 may be implemented with a single package.

Figure 14:
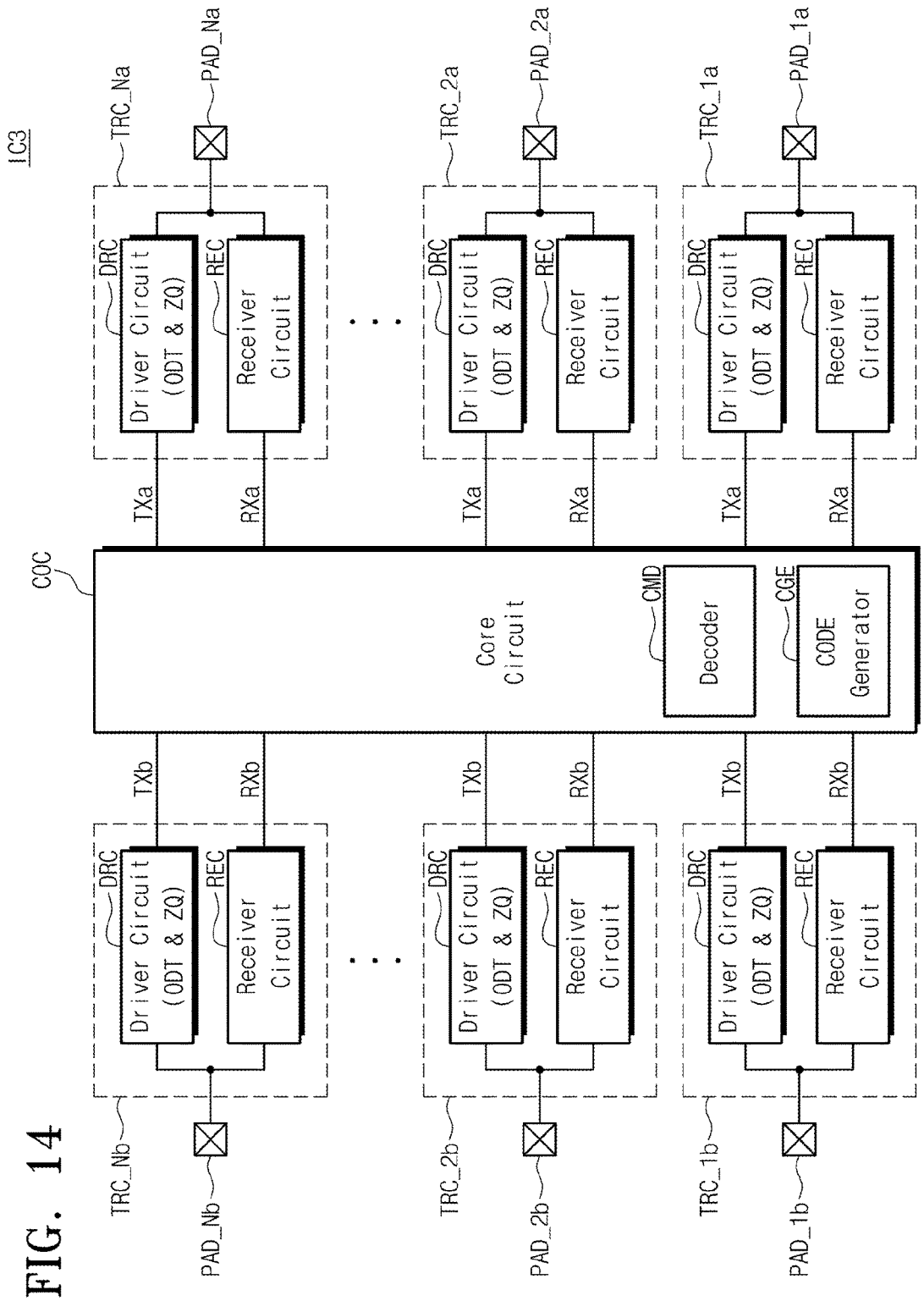
FIG. 14 is a block diagram illustrating an example of a third integrated circuit.

FIG. 14 is a block diagram illustrating an example of a third integrated circuit IC3. As illustrated, the third integrated circuit IC3 includes (1$a$)th to (Na)th pads PAD_1$a$ to PAD_Na, (1$a$)th to (Na)th transceiver circuits TRC_1$a$ to TRC_Na, (1$b$)th to (Nb)th pads PAD_1$b$ to PAD_Nb, (1$b$)th to (Nb)th transceiver circuits TRC_1$b$ to TRC_Nb, and a core circuit COC.

The (1$a$)th to (Na)th pads PAD_1$a$ to PAD_Na may be connected to second integrated circuits IC2. The (1$a$)th to (Na)th transceiver circuits TRC_1$a$ to TRC_Na may be configured to communicate to the second integrated circuits IC2 through the (1$a$)th to (Na)th pads PAD_1$a$ to PAD_Na. Each of the (1$a$)th to (Na)th transceiver circuits TRC_1$a$ to TRC_Na may have the structure described with reference to FIGS. 3 and 4.

The (1$b$)th to (Nb)th pads PAD_1$b$ to PAD_Nb may be connected to the second integrated circuits IC2. The (1$b$)th to (Nb)th transceiver circuits TRC_1$b$ to TRC_Nb may be configured to communicate with the fourth integrated circuit IC4 through the (1$b$)th to (Nb)th pads PAD_1$b$ to PAD_Nb. Each of the (1$b$)th to (Nb)th transceiver circuits TRC_1$b$ to TRC_Nb may have the structure described with reference to FIGS. 3 and 4.

In a normal mode, the core circuit COC may transfer a receive signal RXb received from the a fourth integrated circuit IC4 through the (1$b$)th to (Nb)th pads PAD_1$b$ to PAD_Nb and the (1$b$)th to (Nb)th transceiver circuits TRC_1$b$ to TRC_Nb to the activated second integrated circuit IC2 through the (1$a$)th to (Na)th transceiver circuits TRC_1$a$ to TRC_Na and the (1$a$)th to (Na)th pads PAD_1$a$ to PAD_Na as a transmit signal TXa. The core circuit COC may transfer a receive signal RXa received from the second integrated circuit IC2 through the (1$a$)th to (Na)th pads PAD_1$a$ to PAD_Na and the (1$a$)th to (Na)th transceiver circuits TRC_1$a$ to TRC_Na to the fourth integrated circuit IC4 through the (1$b$)th to (Nb)th transceiver circuits TRC_1$b$ to TRC_Nb and the (1$b$)th to (Nb)th pads PAD_1$b$ to PAD_Nb as a transmit signal TXb. The core circuit COC may be configured to perform retiming during the signal transfer.

The core circuit COC includes a decoder CMD. The decoder CMD is configured to decode a command received from the fourth integrated circuit IC4 through some or all of the (1$b$)th to (Nb)th pads PAD_1$b$ to PAD_Nb and the (1$b$)th to (Nb)th transceiver circuits TRC_1$b$ to TRC_Nb or through a separate channel. When a result of the decoding indicates test entry, the third integrated circuit IC3 may enter a test mode. When the result of the decoding indicates test termination, the third integrated circuit IC3 may terminate the test mode.

The core circuit COC further includes a code generator CGE. The code generator CGE is configured to generate a code CODE from the receive signal RXa received from the second integrated circuit IC2 through the (1$a$)th to (Na)th pads PAD_1$a$ to PAD_Na and the (1$a$)th to (Na)th transceiver circuits TRC_1$a$ to TRC_Na in the test mode.

In example embodiments, the code generator CGE may perform a calibration operation with the activated second integrated circuit IC2 until the receive signal RXa received from the activated second integrated circuit IC2 is aligned, as described with reference to FIGS. 7 and 10 The third integrated circuit IC3 may be configured to directly transfer the code CODE to the activated second integrated circuit IC2.

Alternatively, the code generator CGE may perform the calibration operation described with reference to FIGS. 7 and 10 according to the control of the fourth integrated circuit IC4. The third integrated circuit IC3 may request that the activated second integrated circuit IC2 transfer a test signal according to the control of the fourth integrated circuit IC4. The code generator CGE may generate a code CODE from the test signal received from the activated second integrated circuit IC2. The third integrated circuit IC3 may transfer the generated code CODE to the fourth integrated circuit. The fourth integrated circuit IC4 may transfer the code CODE to the activated second integrated circuit IC2 through the third integrated circuit IC3. That is, the third integrated circuit IC3 may be configured to transfer the code CODE to the activated second integrated circuit IC2 through the fourth integrated circuit IC4.

As previously set forth, the (1a)th to (Na)th transceiver circuits TRC_1$a$ to TRC_Na have the structure described with reference to FIGS. 3 and 4. However, each of the (1$b$)th to (Nb)th transceiver circuits TRC_1$b$ to TRC_Nb may have the structure described with reference to FIGS. 8 and 9. In this case, as described with reference to FIGS. 1 to 6, the fourth integrated circuit IC4 may be configured to generate a code CODE from a test signal transferred from the third integrated circuit IC3 and to transfer the generated code to the third integrated circuit IC3. That is, the fourth integrated circuit IC4 and the third integrated circuit IC3 may perform calibration operations corresponding to the first integrated circuit IC1 and the second integrated circuit IC2, respectively.

As described above with reference to FIG. 13, the fourth integrated circuit IC4 is connected to a RAM. However, as described above with reference to FIGS. 1 and 11, the RAM may be omitted. In contrast, as described above with reference to FIG. 13, the first integrated circuit IC1 in FIGS. 1 and 11 may be configured to communicate with the RAM.

The second to fifth integrated circuits IC2 to IC5 may constitute a solid state driver (SSD).

Figure 15:
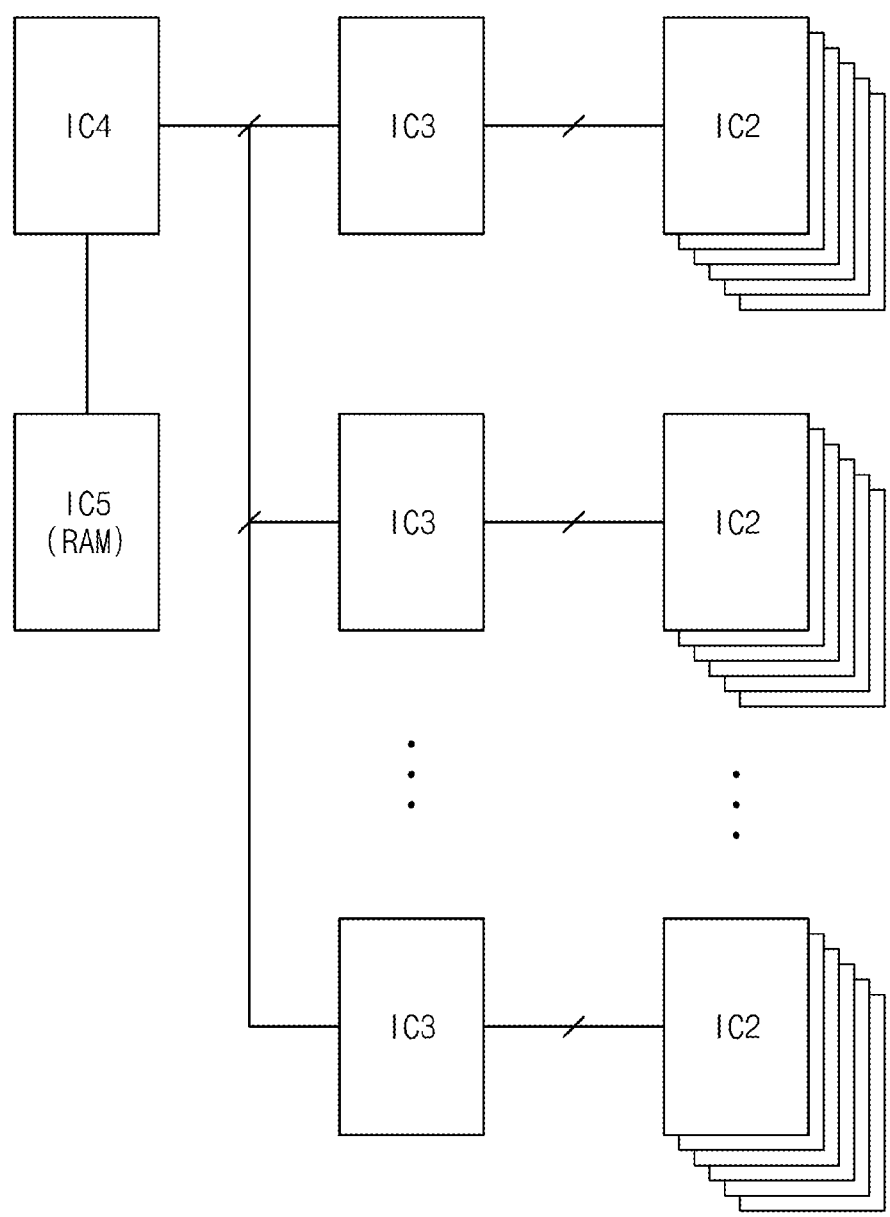
FIG. 15 is a block diagram illustrating another example of the integrated circuits according to example embodiments of inventive concepts.

FIG. 15 is a block diagram illustrating another example of the integrated circuits IC2 to IC5 according to example embodiments of inventive concepts. As illustrated, a fourth integrated circuit IC4 is connected to a fifth integrated circuit IC5 and connected to a plurality of third integrated circuits IC3. Each of the third integrated circuits is connected to a plurality of second integrated circuits IC2.

Each of the second integrated circuits IC2 may include a nonvolatile memory. Each of the third integrated circuits IC3 may be configured to perform retiming between a fourth integrated circuit IC4 and the second integrated circuits IC2. Each of the third integrated circuits IC3 may be configured to perform ZQ calibration and to transfer a code CODE to the second integrated circuits.

The fourth integrated circuit IC4 may be a memory controller to control the second integrated circuits IC2 through the third integrated circuits IC3.

The fifth integrated circuit IC5 may be a RAM used as a buffer memory, a cache memory or a working memory.

The second to fifth integrated circuits IC2 to IC5 may constitute a solid state drive (SSD).

Figure 16:
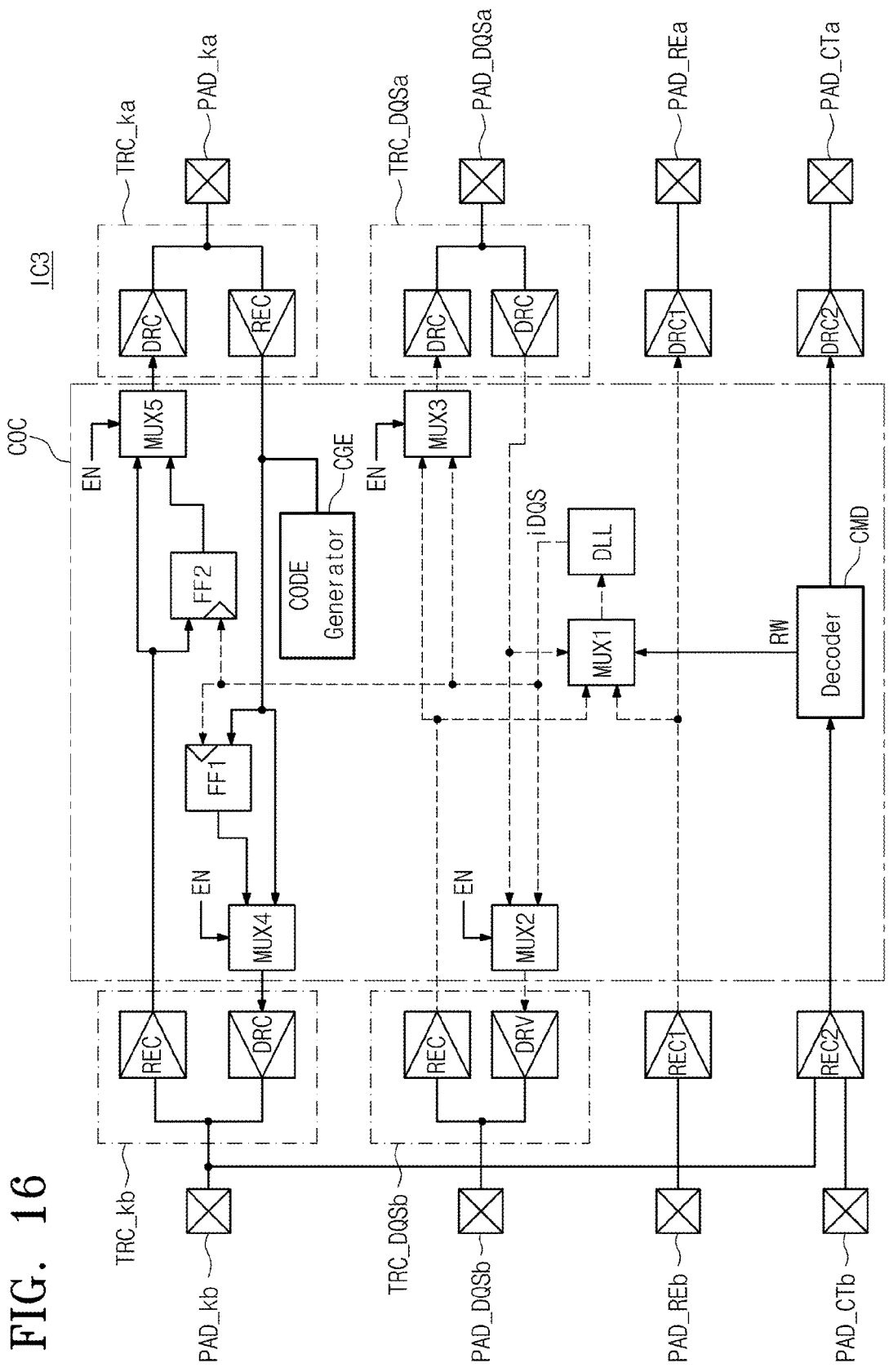
FIG. 16 is a block diagram of a third integrated circuit according to example embodiments of inventive concepts.

FIG. 16 is a block diagram of a third integrated circuit according to example embodiments of inventive concepts. As illustrated, the third integrated circuit IC3 includes pads PAD_ka, PAD_kb, PAD_DQSa, PAD_DQSb, PAD_REa, PAD_REb, PAD_CTa, and PAD_CTb, transceiver circuits TRC_ka, TRC_kb, TRC_DQSa, and TRC_DQSb, transmitter circuits DRC1 and DRC2, receiver circuits REC1 and REC2, and a core circuit COC.

The pad PAD_ka and the transceiver circuit TRC_ka may correspond to the (1a)th to (Na)th pads PAD_1a to PAD_Na and the (1a)th to (Na)th transceiver circuits TRC_1a to TRC_Na in FIG. 14, respectively. For example, the pad PAD_ka and the transceiver circuit TRC_ka may be provided in plurality corresponding to the number of the (1a)th to (Na)th pads PAD_1a to PAD_Na or the number of the (1a)th to (Na)th transceiver circuits TRC_1a to TRC_Na, respectively. The pad PAD_ka may be a data pad connected to nonvolatile memories (e.g., second integrated circuits IC2). The transceiver circuit TRC_ka may transfer/receive data to/from the nonvolatile memories (e.g., the second integrated circuits IC2) through the pad PAD_ka. The transceiver circuit TRC_ka may include a driver circuit DRC to transfer data to the nonvolatile memories (e.g., the second integrated circuits IC2) and a receiver circuit REC to receive data from the nonvolatile memories (e.g. the second integrated circuit IC2) through the pad PAD_ka.

The pad PAD_kb and the transceiver circuit TRC_kb may correspond to the (1b)th to (Nb)th pads PAD_1b to PAD_Nb and the (1b)th to (Nb)th transceiver circuits TRC_1b to TRC_Nb in FIG. 14, respectively. For example, the pad PAD_kb and the transceiver circuit TRC_kb may be provided in plurality corresponding to the number of the (1b)th to (Nb)th pads PAD_1b to PAD_Nb and the number of the (1b)th to (Nb)th transceiver circuits TRC_1b to TRC_Nb.

The pad PAD_kb may be a data pad connected to a memory controller (e.g., the fourth memory circuit IC4). The transceiver circuit TRC_kb may transfer/receive data to/from the memory controller (e.g., the fourth integrated circuit IC4). The transceiver circuit TRC_kb may include a driver circuit DRC to transfer data to the memory controller (e.g., the fourth integrated circuit IC4) through the pad PAD_kb and a receiver circuit REC to receive data from the memory controller (e.g., the fourth integrated circuit IC4) through the pad PAD_kb.

The pad PAD_DQSa may be connected to the nonvolatile memories (e.g., second integrated circuits IC2), and the pad PAD_DQSb may be connected to the memory controller (e.g., the fourth integrated circuit IC4). The transceiver circuit TRC_DQSa may communicate a data strobe signal DQS with the nonvolatile memories (e.g., the second integrated circuits IC2) through the pad PAD_DQSa, and the transceiver circuit TRC_DQSb may communicate the data strobe signal DQS with the memory controller (e.g., the fourth integrated circuit IC4) through the pad PAD_DQSb. For example, the transceiver circuit TRC_DQSb may receive the data strobe signal DQS from the memory controller (.e.g., the fourth integrated circuit IC4) through the pad PAD_DQSb during a data write operation. The data transceiver circuit TRC_DQSa may transfer the data strobe signal DQS to the nonvolatile memories (e.g., the second integrated circuits IC2) through the pad PAD_DQSa during the data write operation. The data transceiver circuit TRC_DQSa may receive the data strobe signal DQS from the nonvolatile memories (e.g., the second integrated circuits IC2) through the pad PAD_DQSa during a data read operation. The transceiver circuit TRC_DQSb may transmit the data strobe signal DQS from the memory controller (e.g., the fourth circuit IC4) through the pad PAD_DQSb. The transceiver circuit TRC_DQSa may include a transmitter circuit DRC to transmit the data strobe signal DQS to the nonvolatile memories (e.g., the second integrated circuits IC2) through the pad PAD_DQSa and a receiver circuit REC to receive the data strobe signal DQS from the nonvolatile memories (e.g., the second integrated circuits IC2) through the pad PAD_DQSa. The transceiver circuit TRC_DQSb may include a transmitter circuit DRC to transmit the data strobe signal DQS to the memory controller (e.g., the fourth integrated circuit IC4) through the pad PAD_DSQb and a receiver circuit REC to receive the data strobe signal DQS from the memory controller (e.g., the fourth integrated circuit IC4) through the pad PAD_DQSb.

The pad PAD_REa may be connected to the nonvolatile memories (e.g., the second integrated circuits IC2), and the pad PAD_REb may be connected to the memory controller (e.g., the fourth integrated circuit IC4). During the data read operation, the transmitter circuit DRC1 may transmit a read enable signal /RE to the nonvolatile memories (e.g., the second integrated circuits IC2) through the pad PAD_REa, and the receiver circuit REC1 may receive the read enable signal /RE from the memory controller (e.g., the fourth integrated circuit IC4) through the pad PAD_REb.

The pad PAD_CTa may be connected to the nonvolatile memories (e.g., the second integrated circuit IC2), and the pad PAD_CTb may be connected to the memory controller (e.g., the fourth integrated circuit IC4). During the data read operation, the transmitter circuit DRC2 may transmit a control signal CT to the nonvolatile memories (e.g., the second integrated circuits IC2) through the pad PAD_CTa and the receiver circuit REC2 may receive the control signal CT from the memory controller (e.g., the fourth integrated circuit IC4) through the pad PAD_CTb. For example, the pad PAD_CTb, the receiver circuit REC2, the transmitter circuit DRC2, and the pad PAD_CTa may each be provided in plurality corresponding to the number of control signals CT transmitted to the nonvolatile memories (e.g., the second integrated circuits IC2) from the memory controller (e.g., the fourth integrated circuit IC4) through the third integrated circuit IC3. For example, the control signal CT may include an address latch enable signal ALE, a command latch enable signal CLE, a write enable signal /WE, and chip enable signal(s) /CE provided to correspond to the number of the nonvolatile memories (e.g., the second integrated circuits IC2) connected to the third integrated circuit IC3.

The decoder CMD may receive the control signal CT including the address latch enable signal ALE, the command latch enable signal CLE, the write enable signal /WE, and the first to Nth chip enable signal /CE from the receiver circuit REC2. The decoder CMD may transmit the received control signal CT to the transmitter signal DRC2.

In response to the control signal CT, the decoder CMD may identify a command input cycle in which a command is input through the transceiver circuit TRC_kb. During the command input cycle, the decoder CMD may interpret a command received through the transceiver circuit TRC_kb. For example, the decoder CMD may identify whether the received command is a read command or a write command. According to a result of the identification, the decoder CMD may control a control signal RW. For example, when the received command is the read command, the decoder CMD may control the control signal RW to a first value. When the received command is the write data, the decoder may control the control signal RW to a second value. When the received command is not the read command or the write command, the decoder CMD may disable the control signal RW.

The read enable signal /RE received through the receiver circuit REC1 is transferred to a first multiplexer MUX1 and the transmitter circuit DRC1.

The data strobe signal DQS received through the transceiver circuit TRC_DQSb is transferred to the first multiplexer MUX1 and the third multiplexer MUX3. The data strobe signal DQS received through the transceiver circuit TRC_DQSa is transferred to the first multiplexer MUX1 and a second multiplexer MUX2.

The first multiplexer MUX1 receives the read enable signal /RE from the first receiver circuit REC1, receives the data strobe signal DQS from the transceiver circuit TRC_DQSb, receives the data strobe signal DQS from the transceiver circuit TRC_DQSa, and receives the control signal RW from the decoder CMD. When the control signal RW indicates a read operation, the first multiplexer MUX1 may transfer the read enable signal /RE received from the receiver circuit REC1 and the data strobe signal DQS received from the transceiver circuit TRC_DQSa to a delay locked loop (DLL).

The DLL receives the read enable signal /RE and the data strobe signal DQS received from the transceiver circuit TRC_DQSa from the first multiplexer MUX1 during a read operation. The DLL may detect a locking delay of a quarter cycle from the read enable signal /RE and output an internal signal iDQS delayed by the quarter cycle from the data strobe signal DQS using the detected locking delay. The internal signal iDQS is transferred to the second multiplexer MUX2 and flip-flops FF1 and FF2.

The first flip-flop FF1 may realign data received through the transceiver circuit TRC_ka in synchronization with the internal signal iDQS during a read operation. The second flip-flop FF2 may realign data received through the transceiver circuit TRC_kb in synchronization with the internal signal iDQS during a write operation.

The second multiplexer MUX2 may receive the internal signal iDQS from the DLL and receive the data strobe signal DQS through the transceiver circuit TRC_DQSa. The second multiplexer MUX2 may transfer the internal signal iDQS or the data strobe signal DQS to the transceiver circuit TRC_DQSb in response to an enable signal EN.

The third multiplexer MUX3 may receive the internal signal iDQS from the DLL and receive the data strobe signal DQS through the transceiver circuit TRC_DQSb. The third multiplexer MUX3 may transfer the internal signal iDQS or the data strobe signal DQS to the transceiver circuit DQS_TRCa in response to the enable signal EN.

The fourth multiplexer MUX4 may receive the realigned data from the first flip-flop FF1 and receive data through the transceiver circuit TRC_DQSa. The fourth multiplexer MUX4 may transfer the realigned data or the data received through the transceiver circuit TRC_ka to the transceiver circuit TRC_kb in response to the enable signal EN.

The fifth multiplexer MUX5 may receive the realigned data from the second flip-flop FF2 and receive data through the transceiver circuit TRC_kb. The fifth multiplexer MUX5 may transfer the realigned data or the data received from the transceiver circuit TRC_DQSb to the transceiver circuit TRC_ka.

When the enable signal is an enabled state and the control signal RW indicates a write operation, the core circuit COC outputs the internal signal iDQS to the transceiver circuit TRC_DQSa and outputs the data realigned by the second flip-flop FF2 to the transceiver circuit TRC_ka. When the enable signal EN is in an enabled state and the control signal RW indicates a read operation, the core circuit COC outputs the internal signal iDQS to the transceiver circuit TRC_DQSb and outputs the data realigned by the first flip-flop FF1 to the transceiver circuit TRC_kb. That is, when the enable signal EN is in an enabled state, the core circuit COC may perform retiming to realign the data and the data strobe signal DQS communicating between a memory controller (e.g., fourth integrated circuit IC4) and nonvolatile memories (e.g., second integrated circuits IC2). When the enable signal EN in a disabled state, the core COC may simply transfer a signal between a memory controller (e.g., fourth integrated circuit IC4) and nonvolatile memories (e.g., second integrated circuit IC2).

When the control signal CT indicates a command input cycle, the decoder CMD may decode a command received through the transceiver circuit TRC_kb. When the decoded command indicates start of a test mode, the core circuit COC may enter the test mode. When the decode command indicates termination of the test mode, the core circuit COC may terminate the test mode. In the test mode, the receiver circuit DRC of the transceiver circuit TRC_ka may perform ZQ calibration. After the ZQ calibration is terminated, the code generator CGE may generate a code CODE based on a receive signal received through the transceiver circuit TRC_ka. The generated code CODE may be transferred to the nonvolatile memories (e.g., second integrated circuits IC2).

Figure 17:
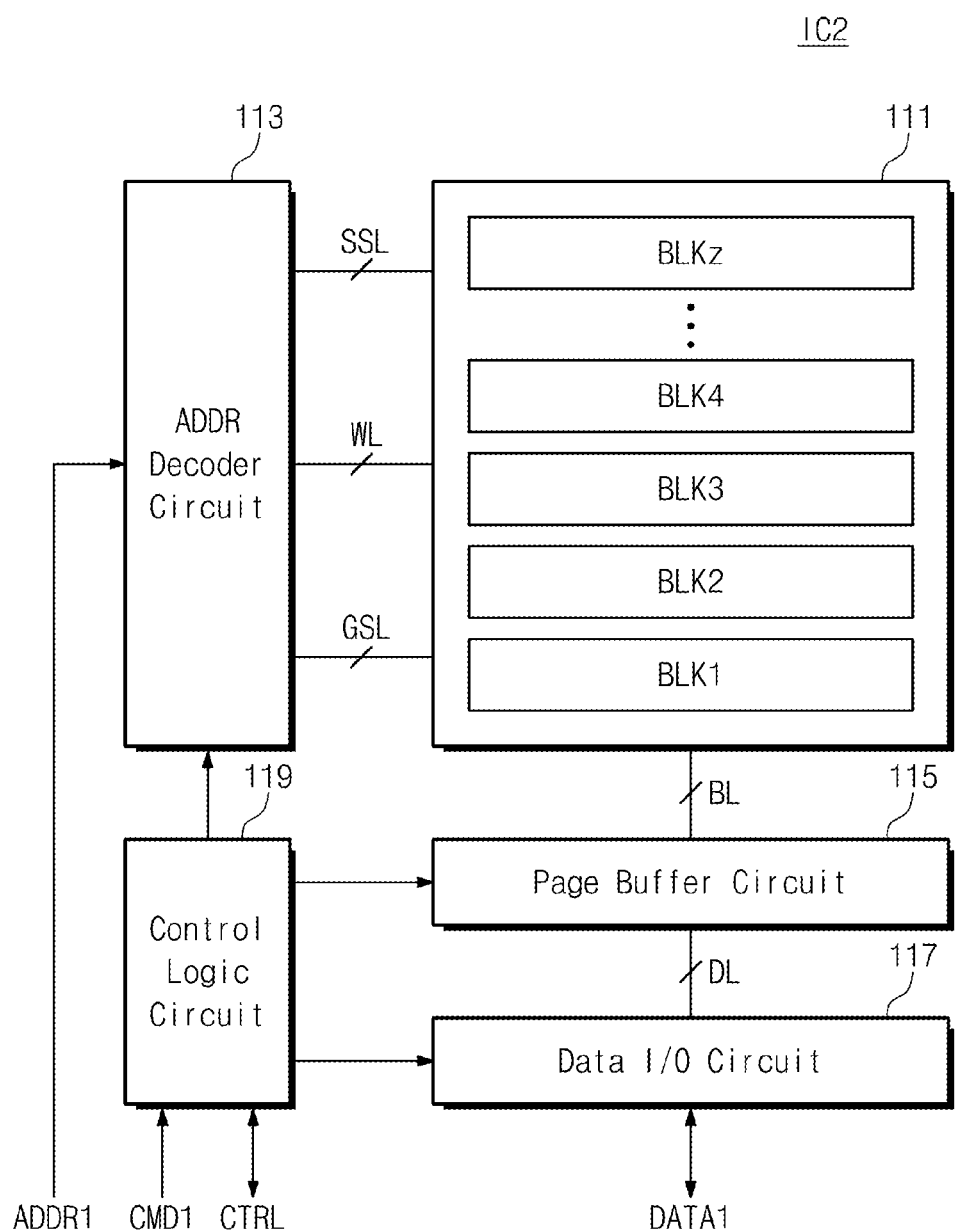
FIG. 17 is a block diagram of a second integrated circuit according to example embodiments of inventive concepts.

FIG. 17 is a block diagram of a second integrated circuit IC2 according to example embodiments of inventive concepts. As illustrated, the second integrated circuit IC2 includes a memory cell array 111, an address decoder circuit 113, a page buffer circuit 115, and a data input/output (I/O) circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the address decoder circuit 113 through at least one ground selection line GSL, a plurality of wordlines WL, and at least one string selection line SSL. Each of the memory blocks BLK1 to BLKz may be connected to a page buffer circuit 115 through a plurality of bitlines BL. The memory blocks BLK1 to BLKz may be commonly connected to the bitlines BL. Memory cells of the memory blocks BLK1 to BLKz may have the same structure. In example embodiments, each of the memory blocks BLK1 to BLKz may be a unit of an erase operation. Memory cells of the memory cell array 111 may be erased in units of a single memory block. Memory blocks belonging to a single memory block may be erased at the same time. In another embodiments, each of the memory blocks BLK1 to BLKz may be divided into a plurality of sub-blocks. Each of the sub-blocks may be a unit of an erase operation.

The address decoder circuit 113 is connected to the memory cell array 111 through a plurality of ground selection lines GSL, a plurality of wordlines WL, and a plurality of string selection lines SSL. The address decoder circuit 113 operates according to the control of the control logic circuit 119. The address decoder circuit 113 may receive a first address ADDR1 from the memory controller 120. The address decoder 113 may decode the received first address ADDR1 and control voltages applied to the wordlines WL according to the decoded address.

For example, during a program operation, the address decoder circuit 113 may apply a program voltage VGPM to a selected wordline of a selected memory block indicated by the first address ADDR1 and apply a pass voltage VPASS to unselected wordlines of the selected memory block. During a read operation, the address decoder circuit 131 may apply a select read voltage VRD to the selected wordline of the selected memory block indicated by the first address ADDR1 and apply an unselect read voltage VREAD to unselected wordlines of the selected memory. During an erase operation, the address decoder circuit 113 may apply an erase voltage (e.g., ground voltage or low voltages having levels similar to that of the ground voltage) to wordlines of the selected memory block indicated by the first address ADDR1.

The page buffer circuit 115 is connected to the memory cell array 111 through a plurality of bitlines BL. The page buffer circuit 115 is connected to the data I/O circuit 117 through a plurality of data lines DL. The page buffer circuit 115 operates according to the control of the control logic 119.

The page buffer circuit 115 may store data to be programmed into memory cells of the memory cell array 111 or data read from the memory cells. During a program operation, the page buffer circuit 115 may store the data to be programmed into the memory cells. The page buffer circuit 115 may bias a plurality of bitlines BL based on stored data. The page buffer circuit 115 may function as a write driver during the program operation. During a read operation, the page buffer circuit 115 may sense voltages of the bitlines BL and store a sensing result. The page buffer circuit 115 may function as a sense amplifier during the read operation.

The data I/O circuit 117 is connected to the page buffer circuit 115 through a plurality of data lines DL. The data I/O circuit 117 may exchange first data DATA1 with a first integrated circuit IC1 or a fourth integrated circuit IC4.

The data I/O circuit 117 may temporarily store the first data DATA1 received from the first integrated circuit IC1 or the fourth integrated circuit IC4. The data I/O circuit 117 may transmit the stored data to the page buffer circuit 115. The data I/O circuit 117 may temporarily store data DATA transmitted from the page buffer circuit 115. The data I/O circuit 117 may transmit the stored data DATA to the first integrated circuit IC1 or the fourth integrated circuit IC4. The data I/O circuit 117 may function as a buffer memory.

The control logic circuit 119 receives a first command CMD1 and a control signal CTRL from the first integrated circuit IC1 or the fourth integrated circuit IC4. The control logic 119 may decode the received first command CMD1 and control the overall operation of the second integrated circuit IC2 according to the decoded command.

In example embodiments, during a read operation, the control logic circuit 119 may generate and output a data strobe signal DQS from a read enable signal /RE of the received control signal CTRL. During a write operation, the control logic circuit 119 may generate and output the data strobe signal DQS from the data strobe signal DQS of the received control signal CTRL.

FIG. 18 is a circuit diagram of a memory block BLKa according to example embodiments of inventive concepts. As illustrated, the memory block BLKa includes a plurality of cell strings CS11 to CS21 and CS12 to CS22. The cell strings CS11 to CS21 and CS12 to CS22 may be arranged in a row direction and a column direction to form rows and columns.

For example, the cell strings CS11 and CS12 arranged in the row direction may form a first row, and the cell strings CS21 and CS22 arranged in the row direction may form a second row. The cell strings CS11 and CS21 arranged in the column direction may form a first column, and the cell strings CS12 and CS22 arranged in the column direction may form a second column.

Each cell string may include a plurality of cell transistors. The cell transistors include ground selection transistors GSTa and GSTb, memory cells MC1 to MC6, and string selection transistors SSTa and SSTb. The ground selection transistors GSTa and GSTb, the memory cells MC1 to MC6, and the string selection transistors SSTa and GSTb of each cell string may be stacked in a direction perpendicular to a plane on which the cell strings CS11 to CS21 and CS12 to CS22 are arranged in a matrix of rows and columns (e.g., a plane on a substrate of the memory block BLKb).

The plurality of cell transistors may be charge trap type transistors having threshold voltages that vary depending on the amount of charges trapped to an insulating layer.

Lowermost ground selection transistors GSTa may be commonly connected to the common source line CSL.

The ground selection transistors GSTa and GSTb of the cell strings CS11 to CS21 and CS12 to CS22 may be commonly connected to the ground selection line GSL.

In example embodiments, ground selection transistors of the same height (or order) may be connected to the same ground selection line, and ground selection transistors of different heights (or orders) may be connected to different ground selection lines. For example, ground selection transistors GSTa of first height may be commonly connected to a first ground selection line, and ground selection transistors of second height may be commonly connected to a second ground selection line.

In example embodiments, ground selection transistors of the same row may be connected to the same ground selection line, and ground selection transistors of different rows may be connected to different ground selection lines. For example, ground selection transistors GSTa and GSTb of cell strings CS11 and CS12 of a first row may be connected to a first ground selection line, and ground selection lines GSTa and GSTb of cell strings CS21 and CS22 of a second row may be connected to a second ground selection line.

Memory cells disposed at the same height (or order) from a substrate (or ground selection transistors GST) may be connected to a single wordline, and memory cells disposed at different heights (or orders) may be connected to different wordlines WL1 to WL6, respectively. For example, memory cells MC1 are commonly connected to the wordline WL1. Memory cells MC3 are commonly connected to the wordline WL4. Memory cells MC4 are commonly connected to the wordline WL5. Memory cells MC6 are commonly connected to the wordline WL6.

In a first string selection transistor SSTa of the same height (or order) of the cell strings CS11 to CS21 and CS12 to CS22, first string selection transistors SSTa of different rows are connected to different string selection lines SSL1a to SSL2a, respectively. For example, first string selection transistors SSTa of the cell strings CS11 and CS12 are commonly connected to a string selection line SSL1a. First string selection transistors SSTa of the cell strings CS21 and CS22 are commonly connected to a string selection line SSL2a.

In a second string selection transistor SSTb of the same height (or order) of the cell strings CS11 to CS21 and CS12 to CS22, second string selection transistors SSTb of different rows are connected to different string selection lines SSL1b to SSL2b, respectively. For example, second string selection transistors SSTb of the cell strings CS11 and CS12 are commonly connected to a string selection line SSL1b. First string selection transistors SSTb of the cell strings CS21 and CS22 are commonly connected to a string selection line SSL2b.

That is, cell strings of different rows are connected to different string selection lines. String selection transistors of the same height (or order) of the same row are connected to the same string selection line. String selection transistors of different heights (or orders) of the same row are connected to different string selection lines.

That is, cell strings of different rows are connected to different string selection lines. String selection transistors of the same height (or order) of the same row are connected to the same string selection line. String selection transistors of different heights (or orders) of the same row are connected to different string selection lines.

In example embodiments, string selection transistors of cell strings of the same row may be connected to a single string selection line. For example, string selection transistors SSTa and SSTb of a first row may be commonly connected to a single string selection line. String selection transistors SSTa and SSTb of cell strings CS21 and CS22 of a second row may be commonly connected to a single string selection line.

Columns of a plurality of cell strings CS11 to CS21 and CS12 to CS22 are connected to different bitlines BL1 and BL2, respectively. For example, string selection transistors SSTb of cell strings CS11 to CS21 of a first column are commonly connected to a bitline BL1. String selection transistors SST of cell strings CS12 to CS22 of a second column are commonly connected to a bitline BL2.

The cell strings CS11 and CS12 may form a first plane. The cell strings CS21 and CS22 may form a second plane.

In the memory block BLKa, write and read operations may be performed in units of rows. For example, a single plane of the memory block BLKa may be selected by string selection lines SSL1a, SSL1b, SSL2a, and SSL2b. When the string selection lines SSL1a and SSL1b are supplied with a turn-on voltage and the string selection lines SSL2a and SSL2b are supplied with a turn-off voltage, cell strings CS11 and CS12 of the first plane are connected to the bitlines BL1 and BL2, i.e., the first plane is selected. When the string selection lines SSL2a and SSL2b are supplied with a turn-on voltage and the string selection lines SSL1a and SSL1b are supplied with a turn-off voltage, cell strings CS21 and CS22 of the second plane are connected to the bitlines BL1 and BL2, i.e., the second plane is selected. In the selected plane, a single row of the memory cells MC may be selected by the wordlines WL1 to WL6. In the selected row, a write or read operation may be performed.

In the memory block BLKa, an erase operation may be performed units of memory blocks or sub-blocks. When the erase operation is performed in units of memory blocks, all memory cells MC of the memory block BLKa may be erased at the same time according to a single erase request. When the erase operation is performed in units of sub-blocks, some of the memory cells MC of the memory block BLKa may be erased at the same time according to a single erase request and the others may be erase-inhibited. A wordline connected to erased memory cells may be supplied with a low voltage (e.g., ground voltage), and a wordline connected to erase-inhibited memory cells may be floated.

The memory block BLKa shown in FIG. 18 is merely exemplary. The present inventive concepts are not limited to the memory block BLKa shown in FIG. 14. For example, the number of rows of cell strings may increase or decrease. As the number of the rows of the cell strings varies, the number of string selection lines or the number of ground selection lines, and the number of cell strings connected to a single bitline may also vary.

The number of columns of cell strings may increase or decrease. As the number of columns of cell strings varies, the number of bitlines connected to the columns of the cell strings and the number of cell strings connected to a single string selection line may also vary.

The height of cell strings may increase or decrease. For example, the number of ground selection transistors, memory cells or string selection transistors stacked on the respective cell strings may increase or decrease.

In example embodiments, memory cells belonging to a single physical page may correspond to at least three logical pages. For example, k bits (k being a positive integer greater than 2) may be programmed into a single memory cell MC. In the memory cells CM belonging to the single physical page, k bits programmed into each memory cell MC may form k logical pages, respectively.

In example embodiments, the memory block BLKa may be embodied to include a three dimensional (3D) memory array. The 3D memory array may be monolithically formed on a substrate (e.g., semiconductor substrate such as silicon or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments of inventive concepts, the 3D memory array may include vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 19:
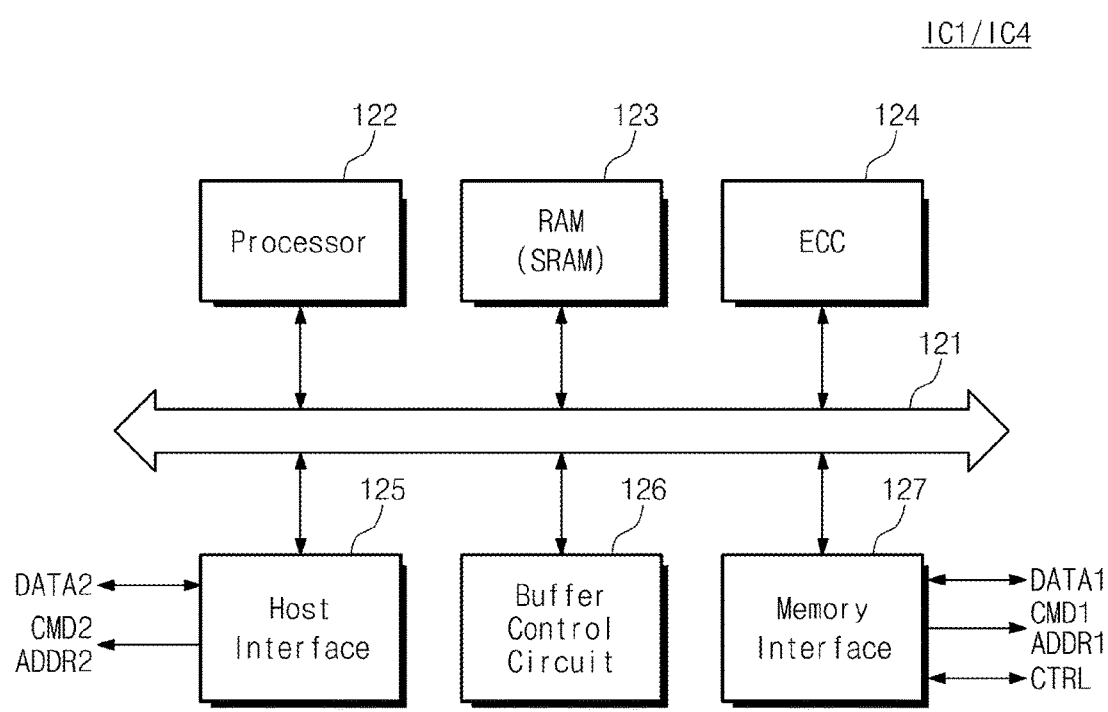
FIG. 19 is a block diagram of a first or fourth integrated circuit according to example embodiments of inventive concepts.

FIG. 19 is a block diagram of a first integrated circuit IC1 or a fourth integrated circuit IC4 according to example embodiments of inventive concepts. As illustrated, the first integrated circuit IC1 or the fourth integrated circuit IC4 includes a bus 121, a processor 122, a RAM 123, an error correction block (ECC) 124, a host interface 125, a buffer control circuit 126, and a memory interface 127.

The bus 121 is configured to provide a channel between components of the first integrated circuit IC1 or the fourth integrated circuit IC4.

The processor 122 may control the overall operation of the first integrated circuit IC1 or the fourth integrated circuit IC4 and perform a logical operation. The processor 122 may communicate with an external host (see FIG. 1) through the host interface 125. The processor 122 may store a second command CMD2 or a second address ADDR2 received through the host interface 125 in the RAM 123. The processor 122 may generate a first command CMD1 or a first address ADDR1 according to the second command CMD2 or the second address ADDR2 stored in the RAM 123 and output the first command CMD1 and the first address ADDR1 through the memory interface 127.

The processor 122 may output second data DATA2 received through the host interface 125 through the buffer control circuit 126 or store the second data DATA2 in the RAM 123. The processor 122 may output data stored in the RAM 123 or data received through the buffer control circuit 126 as first data DATA1 through the memory interface 127. The processor 122 may store the first data DATA1 received through the memory interface 127 or output the first data DATA1 through the buffer control circuit 126. The processor 122 may output data stored in the RAM 123 or data received through the buffer control circuit 126 as the second data DATA2 through the host interface 125 or as the first data DATA1 through the memory interface 127.

The RAM 123 may be used as a working memory, a cache memory or a buffer memory of the processor 122. The RAM 123 may store codes and commands executed by the processor 122. The RAM 123 may store data processed by the processor 122. The RAM 123 may include a static RAM (SRAM).

The ECC 124 may perform error correction. The ECC 124 may generate an error correction code (e.g., parity) for performing error correction based on the first data DATA1 to be output to the memory interface 127 or the second data DATA2 received from the host interface 125. The first data and the parity may be output through the memory interface 127. The ECC 124 may perform error correction of the received first data DATA1 using the first data DATA1 and the parity received through the memory interface 127. In example embodiments, the ECC 124 may be included in the memory interface as a component of the memory interface 127.

The host interface 125 is configured to communicate with an external host device 100 (see FIG. 1) according to the control of the processor 122. The host interface 125 may receive a second command CMD2 and a second address ADDR2 from the external host device 100 and exchange the second data DATA2 with the external host device.

The host interface 125 may be configured to perform communication based on at least one of various communication protocols such as USB (Universal Serial Bus), SATA (Serial AT Attachment), SAS (Serial Attached SCSI), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The buffer control circuit 126 is configured to control a fifth integrated circuit IC5 (see FIG. 13 or 15) according to the control of the processor 122. The buffer control circuit 126 may write data into the RAM 130 and read data from the fifth integrated circuit IC5.

The memory interface 127 is configured to communicate with the third integrated circuit IC3 (see FIG. 13 or 15) according to the control of the processor 122. The memory interface 127 may transmit the first command CMD1 and the first address ADDR1 and transmit/receive the first data DATA1 and a control signal CTRL.

In example embodiments, when the first integrated circuit IC1 or the fourth integrated circuit IC4 is not connected to the fifth integrated circuit IC5, the first integrated circuit IC1 or the four integrated circuit IC4 may not be provided with the buffer control circuit 126 and the function of the fifth integrated circuit IC5 may be performed by the RAM 123 in the first integrated circuit IC1 or the fourth integrated circuit IC4.

In example embodiments, the processor 122 may control the first integrated circuit IC1 or the fourth integrated circuit IC4 using codes. The processor 122 may load codes from the nonvolatile memory (e.g., ROM) provided in the first integrated circuit IC1 or the fourth integrated circuit IC4. Alternatively, the processor 122 may load codes received from the memory interface 127.

In example embodiments, the bus 121 of the first integrated circuit IC1 or the fourth integrated circuit IC4 may be classified into a control bus and a data bus. The data bus may be configured to transmit data in the first integrated circuit IC1 or the fourth integrated circuit IC4, and the control bus may be configured to transmit control information such as a command and an address in the first integrated circuit IC1 or the fourth integrated circuit IC4. The data bus and the control bus may be separated from each other and may not interfere with each other or may not have an influence on each other. The data bus may be connected to the host interface 125, the buffer control circuit 126, the ECC 124, and the memory interface 127. The control bus may be connected to the host interface 125, the processor 122, the buffer control circuit 126, the RAM 123, and the memory interface 127.

The above-disclosed subject matter is to be considered illustrative, and not restrictive, and the appended claims are intended to cover all such modifications, enhancements, and other features, which fall within the true spirit and scope of inventive concepts. Descriptions of features or aspects within each device or method according to example embodiments should typically be considered as available for other similar features or aspects in other devices or methods according to example embodiments. Thus, to the maximum extent allowed by law, the scope of inventive concepts is to be determined by the broadest permissible interpretation of the following claims and their equivalents, and shall not be restricted or limited by the foregoing detailed description.

While some example embodiments have been particularly shown and described, it will be understood by one of ordinary skill in the art that variations in form and detail may be made therein without departing from the spirit and scope of the claims.

What is claimed is:

1. An integrated circuit comprising:
   an input/output pad;
   a driver circuit connected to the input/output pad, the driver circuit being configured to output an output signal to an external device through the input/output pad;
   a receiver circuit connected to the input/output pad, the receiver circuit being configured to receive an input signal from the external device through the input/output pad; and
   a code generator configured to generate a termination code of the external device in response to a signal output from the receiver circuit.

2. The integrated circuit as set forth in claim 1, wherein the code generator is configured to detect a detected duty ratio of the signal output from the receiver circuit.

3. The integrated circuit as set forth in claim 2, wherein the termination code includes information on whether the detected duty ratio is greater than a reference ratio or smaller than the reference ratio.

4. The integrated circuit as set forth in claim 1, wherein the code generator is configured to detect a high level and a low level of the signal output from the receiver circuit.

5. The integrated circuit as set forth in claim 4, wherein the termination code includes information on a magnitude of the high level of the signal output from the receiver circuit and a magnitude of the low level of the signal output from the receiver circuit.

6. The integrated circuit as set forth in claim 1, wherein the driver circuit is configured to output the termination code to the external device through the input/output pad as the output signal.

7. The integrated circuit as set forth in claim 1, further comprising:
   a second input/output pad;
   a second driver circuit connected to the second input/output pad, the second driver circuit being configured to output a second output signal to a second external device through the second input/output pad; and
   a second receiver circuit connected to the second input/output pad, the second receiver circuit being configured to receive a second input signal from the second external device through the second input/output pad.

8. The integrated circuit as set forth in claim 7, wherein the second driver circuit is configured to output the termination code to the second external device through the second input/output pad as the second output signal.

9. The integrated circuit as set forth in claim 7, wherein the code generator is configured to detect the termination code in response to a command received from the second external device through the second input/output pad as the second input signal.

10. The integrated circuit as set forth in claim 7, wherein the code generator is configured to detect the termination code in a test mode.

11. The integrated circuit as set forth in claim 7, wherein the integrated circuit is configured to transfer a signal output from the receiver circuit to the second driver circuit after retiming the signal output from the receiver circuit and to transfer a signal output from the second receiver circuit to the driver circuit after retiming the signal output from the second receiver circuit.

12. An integrated circuit comprising:
    an input/output pad;
    a driver circuit connected to the input/output pad, the driver circuit being configured to output an output signal to an external device through the input/output pad, the driver circuit being configured to adjust pull-up drive strength and pull-down drive strength based on a termination code received through the input/output pad; and
    a receiver circuit connected to the input/output pad, the receiver circuit being configured to receive an input signal from the external device through the input/output pad.

13. The integrated circuit as set forth in claim 12, wherein
    the driver circuit includes a pull-up driver coupled between the input/output pad and a power supply node,
    the power supply node is configured to receive a power supply voltage applied thereto,
    the driver circuit includes a pull-down driver coupled between the input/output pad and a ground node,
    the ground node is configured to receive a ground voltage applied thereto, and
    the driver circuit is configured to adjust the pull-up drive strength of the pull-up driver and the pull-down drive strength of the pull-down driver according to the termination code.

14. The integrated circuit as set forth in claim 13, wherein
    the pull-up driver includes a plurality of switches connected to the power supply node, the pull-up driver includes a plurality of transistors coupled between the switches and the input/output pad, respectively, and
    the pull-up driver is configured to apply a voltage equivalently to gates of the transistors according to information output as the output signal, and
    the pull-up driver is configured to activate a number of the switches according to the termination code.

15. The integrated circuit as set forth in claim 13, wherein
    the driver circuit is configured to activate one of the pull-up driver and the pull-down driver and to deactivate an other one of the pull-up driver and the pull-down driver when the driver circuit outputs the output signal, and
    the driver circuit is configured to simultaneously activate the pull-up drivers and the pull-down drivers when the receiver circuit receives the input signal.

16. An integrated circuit comprising:
    a first circuit (IC1) and a second circuit (IC2) configured to communicate with each other using a first communication structure of the IC1 and a second communication structure of the IC2,
    the IC1 including a first core circuit and a first transceiver circuit,
    the IC2 including a second transceiver circuit,
    the IC2 being configured to transfer a signal to the IC1,
    the IC1 being configured generate a code from the signal and to transfer the code to the IC2 using the first core circuit, the first transceiver circuit, and the first and second communication structures, and
    the second transceiver circuit being configured to adjust a drive strength according to the code transferred from the IC1 to the IC2.

17. The integrated circuit as set forth in claim 16,
    the first communication structure is a first input/output pad, the second communication structure is a second input/output pad, the first transceiver circuit includes a first pull-up resistor circuit and a first pull-down resistor circuit that are connected to the first input/output pad, the IC1 is configured to perform a ZQ calibration function on the first transceiver circuit to adjust resistances of the first pull-up resistor circuit and the first pull-down resistor circuit using temperature information sensed from the first transceiver circuit, the IC2 is not configured to perform the ZQ calibration function on the second transceiver circuit, and the second transceiver circuit is configured to adjust pull-up drive strength and pull-down drive strength according to the code transferred from the IC1 to the IC2.

18. The integrated circuit as set forth in claim 16, wherein the first core circuit is configured to detect a duty ratio of the signal transferred from the IC2 to the IC1.

19. The integrated circuit as set forth in claim 16, wherein the first core circuit is configured to detect a high level and low level of the signal transferred from the IC2 to the IC1.

20. The integrated circuit as set forth in claim 16, wherein the IC2 includes a memory cell array, the memory cell array includes a plurality of memory cell strings, and each of the memory cell strings includes a plurality of memory cells stacked on top of each other in a vertical direction between a ground selection transistor and a string selection transistor.

* * * * *